United States Patent
Kim et al.

(10) Patent No.: US 11,677,029 B2
(45) Date of Patent: Jun. 13, 2023

(54) SEMICONDUCTOR DEVICE INCLUDING ACTIVE PATTERN HAVING A PROTRUSION PORTION ON A BASE PORTION AND METHOD FOR MANUFACTURING THE SAME

(71) Applicant: Samsung Electronics Co., Ltd., Suwon-si (KR)

(72) Inventors: Sungmin Kim, Incheon (KR); Dongwon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/464,102

(22) Filed: Sep. 1, 2021

(65) Prior Publication Data

US 2022/0310842 A1    Sep. 29, 2022

(30) Foreign Application Priority Data

Mar. 26, 2021    (KR) ........................ 10-2021-0039298

(51) Int. Cl.
*H01L 29/78*    (2006.01)
*H01L 29/36*    (2006.01)
*H01L 29/06*    (2006.01)

(52) U.S. Cl.
CPC ...... *H01L 29/7853* (2013.01); *H01L 29/0657* (2013.01); *H01L 29/36* (2013.01)

(58) Field of Classification Search
None
See application file for complete search history.

(56) References Cited

U.S. PATENT DOCUMENTS

| | | | |
|---|---|---|---|
| 2009/0085119 A1 | 4/2009 | Ernst et al. | |
| 2013/0075797 A1 | 3/2013 | Okano | |
| 2015/0364594 A1 | 12/2015 | Mieno | |
| 2017/0077232 A1* | 3/2017 | Balakrishnan | H01L 29/7853 |
| 2017/0236937 A1 | 8/2017 | Balakrishnan et al. | |
| 2018/0145076 A1 | 5/2018 | Wang et al. | |
| 2018/0175167 A1* | 6/2018 | Reboh | H01L 29/7848 |
| 2019/0027570 A1 | 1/2019 | Ching et al. | |
| 2019/0097055 A1* | 3/2019 | Dewey | H01L 21/823878 |
| 2020/0135587 A1 | 4/2020 | Cheng et al. | |
| 2020/0328300 A1 | 10/2020 | Chen et al. | |

FOREIGN PATENT DOCUMENTS

KR    10-2020-0050353 A    5/2020

* cited by examiner

*Primary Examiner* — Bilkis Jahan
(74) *Attorney, Agent, or Firm* — Harness, Dickey & Pierce, P.L.C.

(57) ABSTRACT

A semiconductor device including an active pattern, which has a base portion and a protrusion portion on the base portion, and a source/drain pattern provided on the base portion may be provided. The protrusion portion may include a first curved pattern portion, a first flat pattern portion disposed at a lower level than the first curved pattern portion, and a second curved pattern portion disposed at a lower level than the first flat pattern portion. Each of the first and second curved pattern portions has a curved side wall, and the first flat pattern portion has a flat side wall. The germanium concentration of the first curved pattern portion is a higher than the germanium concentration of the first flat pattern portion, and the germanium concentration of the first flat pattern portion is higher than the germanium concentration of the second curved pattern portion.

20 Claims, 20 Drawing Sheets

SEMICONDUCTOR DEVICE INCLUDING ACTIVE PATTERN HAVING A PROTRUSION PORTION ON A BASE PORTION AND METHOD FOR MANUFACTURING THE SAME

CROSS-REFERENCE TO THE RELATED APPLICATION

This application claims priority under 35 U.S.C. § 119 Korean Patent Application No. 10-2021-0039298, filed on Mar. 26, 2021, in the Korean Intellectual Property Office, the disclosure of which is incorporated herein by reference in its entirety.

BACKGROUND

1. Field

Some example embodiments of the disclosure relate to semiconductor devices and/or methods for manufacturing the same. In particular, some example embodiments of the disclosure relate to semiconductor devices including an active pattern and/or methods for manufacturing the same.

2. Description of the Related Art

Semiconductor devices are being highlighted in electronics industries in accordance with characteristics thereof such as miniaturization, multifunctionalization, and low manufacturing costs. Semiconductor devices may be classified into a semiconductor memory device to store logic data, a semiconductor logic device to arithmetically process logic data, a hybrid semiconductor device including a memory element and a logic element, etc. In accordance with the advances in electronics industries, demand for characteristics of semiconductor devices is gradually increasing. For example, demand for high reliability, high speed, multifunctionalization, etc. of semiconductor devices is gradually increasing. In order to satisfy such demanded characteristics, structures in semiconductor devices become more and more complicated. In addition, semiconductor devices become more and more highly integrated.

SUMMARY

Some example embodiments of the disclosure provide semiconductor devices including an active pattern enhanced in current flow, and/or methods for manufacturing the same.

A semiconductor device according to some example embodiments of the disclosure may include an active pattern including a base portion and a protrusion portion on the base portion, and a source/drain pattern on the base portion. The protrusion portion may include a first curved pattern portion, a first flat pattern portion, and a second curved pattern portion, the first flat pattern portion being at a lower level than the first curved pattern portion, the second curved pattern portion being at a lower level than the first flat pattern portion. Each of the first and second curved pattern portions may have a curved side wall. The first flat pattern portion may have a flat side wall. A germanium concentration of the first curved pattern portion may be a higher than a germanium concentration of the first flat pattern portion. The germanium concentration of the first flat pattern portion may be higher than a germanium concentration of the second curved pattern portion.

A semiconductor device according to some example embodiments of the disclosure may include an active pattern including a base portion and a protrusion portion on the base portion, and a source/drain pattern provided on the base portion. The protrusion portion may include a first flat pattern portion and a first curved pattern portion being at a lower level than the first flat pattern portion. A minimum width of the first flat pattern portion may be greater than a minimum width of the first curved pattern portion. A germanium concentration of the first flat pattern portion may be higher than a germanium concentration of the first curved pattern portion.

A semiconductor device according to some example embodiments of the disclosure may include an active pattern including a base portion and a protrusion portion on the base portion, a source/drain pattern on the base portion, and a gate structure on the protrusion portion. A level of a boundary between the base portion and the protrusion portion may be equal to a level of a bottom surface of the source/drain pattern. The protrusion portion may include a first flat pattern portion and a first curved pattern portion being at a lower level than the first flat pattern portion. A side wall of the first flat pattern portion may be flat. A side wall of the first curved pattern portion may be curved. A minimum width of the first flat pattern portion may be greater than a minimum width of the first curved pattern portion. A germanium concentration of the first flat pattern portion may be higher than a germanium concentration of the first curved pattern portion. The germanium concentration of the first curved pattern portion may be higher than a germanium concentration of the base portion.

A method for manufacturing a semiconductor device in accordance with some example embodiments of the disclosure may include alternately forming first semiconductor layers and second semiconductor layers on a substrate, patterning the first semiconductor layers and the second semiconductor layers to form forming first preliminary pattern portions and second preliminary pattern portions, selectively etching the first preliminary pattern portions such that each of the selectively etched first preliminary pattern portions having a curved side wall, performing an annealing process such that germanium in the first preliminary pattern portions is diffused into the second preliminary pattern portions, and etching the first preliminary pattern portions and the second preliminary pattern portions to form a protrusion portion of an active pattern.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1A:
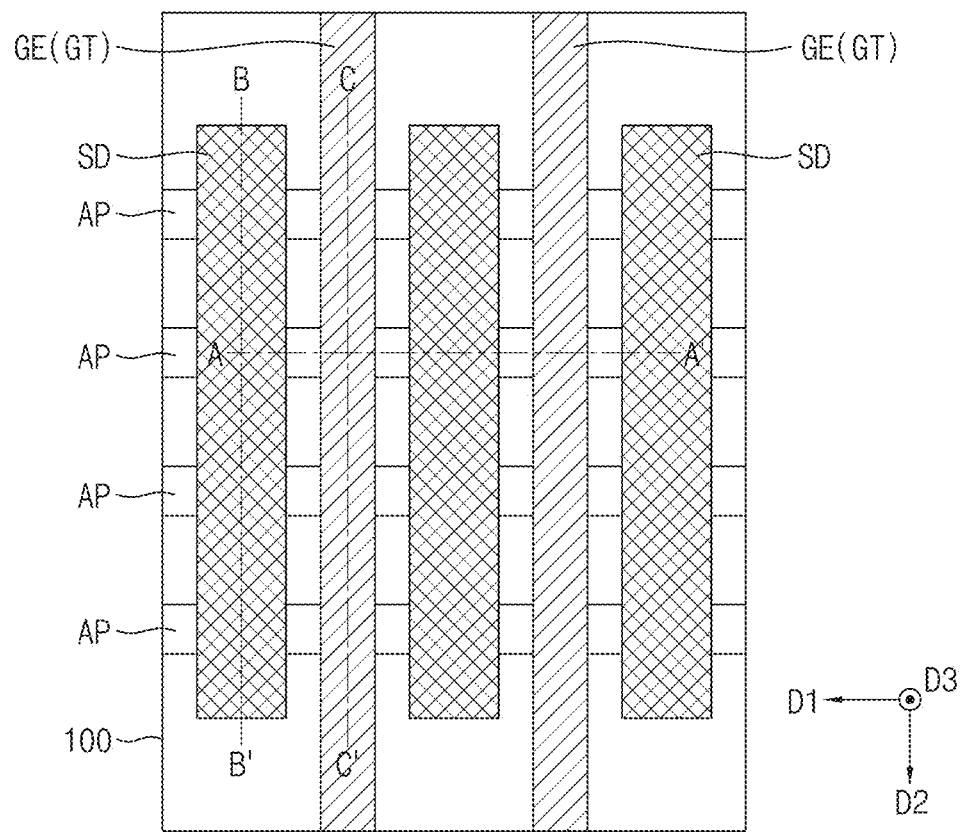
FIG. 1A is a plan view of a semiconductor device according to some example embodiments of the disclosure.
Figure 1B:
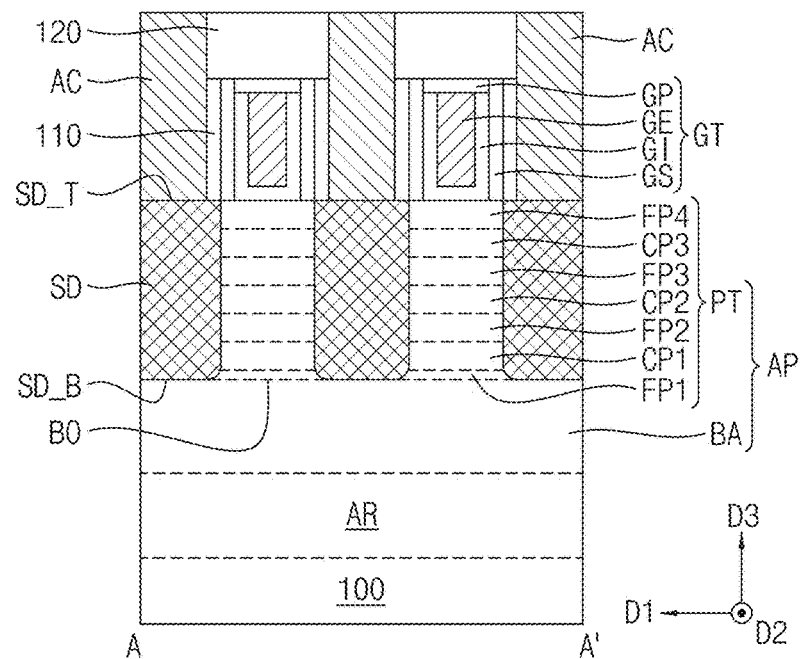
FIG. 1B is a cross-sectional view taken along line A1-A1' in FIG. 1A.
Figure 1C:
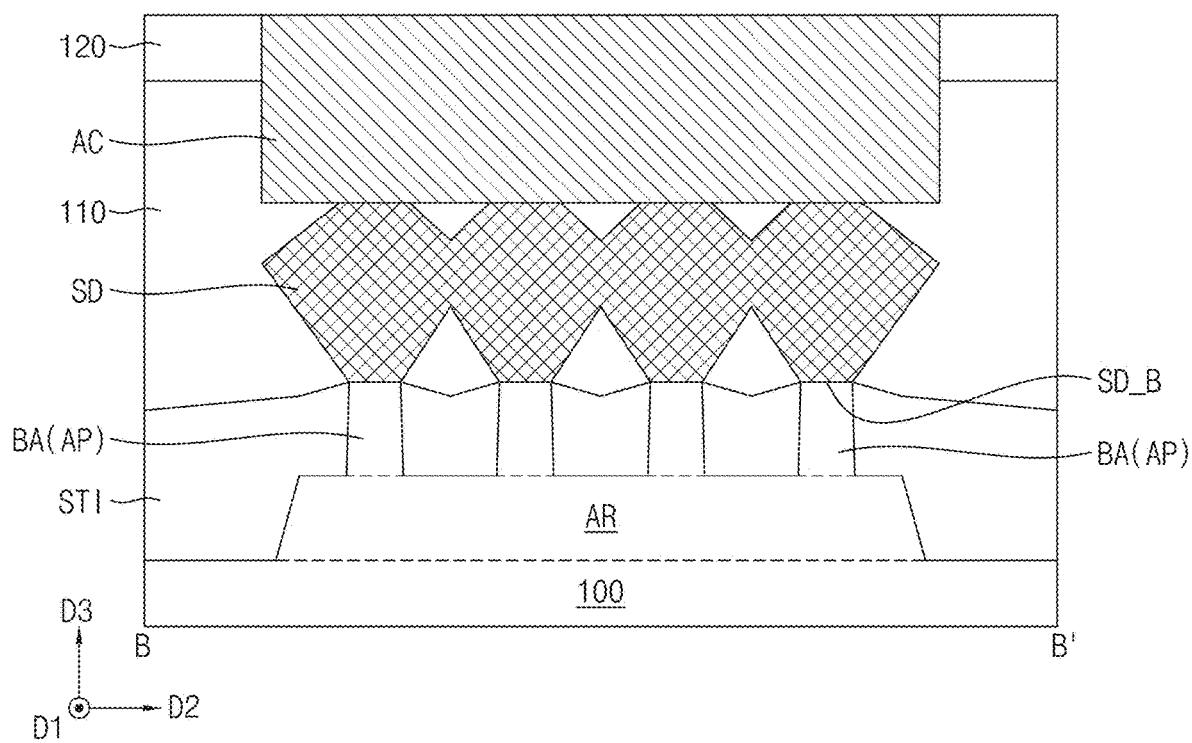
FIG. 1C is a cross-sectional view taken along line B1-B1' in FIG. 1A.
Figure 1D:
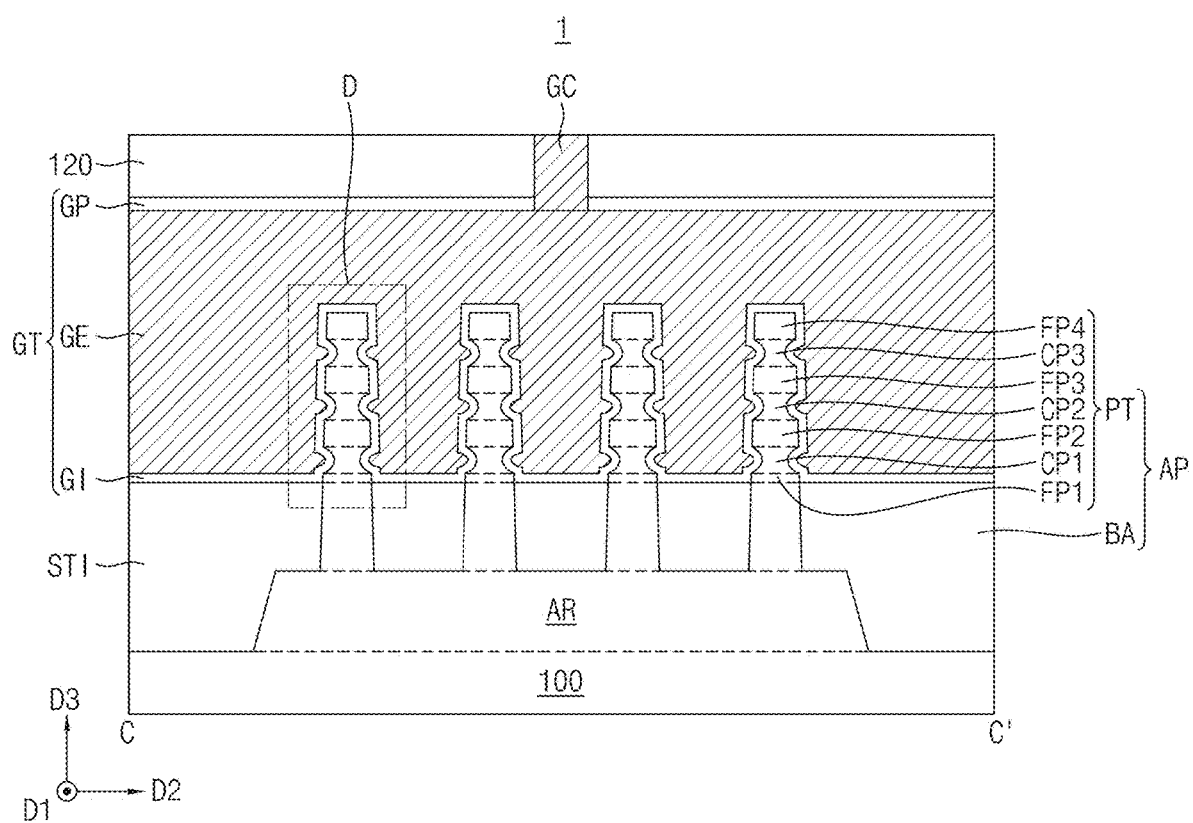
FIG. 1D is a cross-sectional view taken along line C1-C1' in FIG. 1A.
Figure 1E:
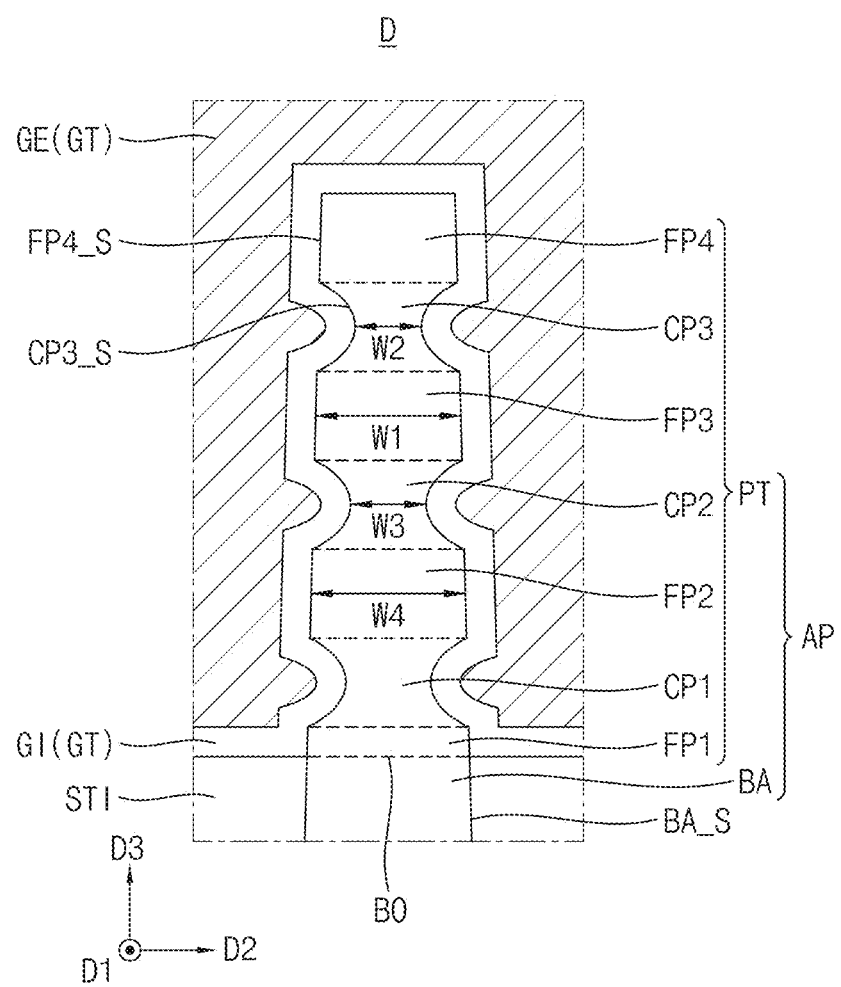
FIG. 1E is an enlarged view of a portion D of FIG. 1D.
Figure 1F:
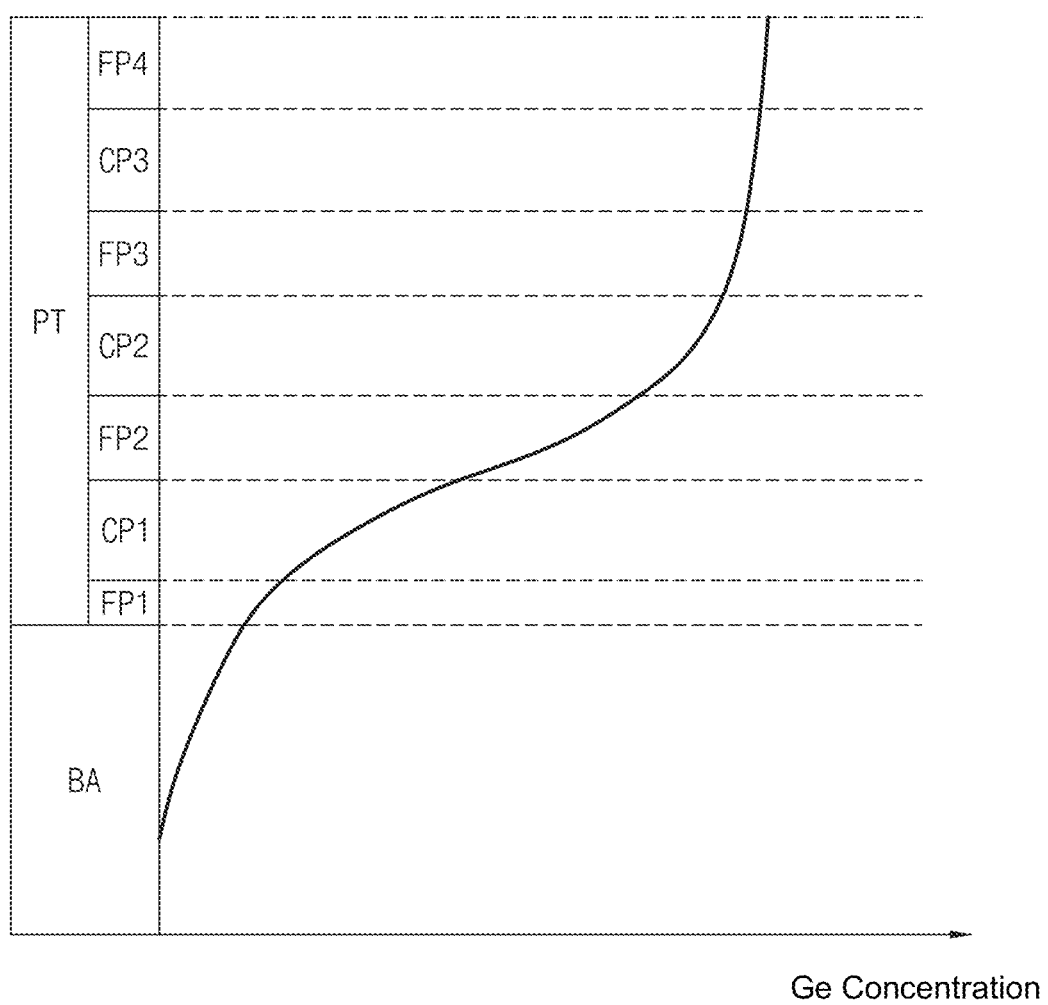
FIG. 1F is a graph explaining a germanium concentration of an active pattern in the semiconductor device according to FIGS. 1A to 1E.

FIG. 1A is a plan view of a semiconductor device according to some example embodiments of the disclosure. FIG. 1B is a cross-sectional view taken along line A1-A1' in FIG. 1A. FIG. 1C is a cross-sectional view taken along line B1-B1' in FIG. 1A. FIG. 1D is a cross-sectional view taken along line C1-C1' in FIG. 1A. FIG. 1E is an enlarged view of a portion D of FIG. 1D. FIG. 1F is a graph explaining a germanium concentration of an active pattern in the semiconductor device according to FIGS. 1A to 1E.

Referring to FIGS. 1A, 1B, 1C and 1D, a semiconductor device 1 may include a substrate 100. The substrate 100 may be a semiconductor substrate. For example, the substrate 100 may be a silicon substrate. The substrate 100 may have the form of a plate extending along a plane defined by a first direction D1 and a second direction D2. The first direction D1 and the second direction D2 may intersect each other. For example, the first direction D1 and the second direction D2 may perpendicularly intersect each other.

The substrate 100 may include an active region AR. The active region AR may be a portion of the substrate 100. The active region AR may extend in the first direction D1. In some example embodiments, the substrate 100 may include a plurality of active regions AR, and each of the plurality of active regions AR may be a PMOSFET region or an NMOSFET region.

Active patterns AP may be provided on the active region AR. The active patterns AP may protrude from a top surface of the active region AR in a third direction D3. The third direction D3 may intersect the first direction D1 and the second direction D2. For example, the third direction D3 may perpendicularly intersect the first direction D1 and the second direction D2. The active patterns AP may extend in the first direction D1. The active patterns AP may be arranged in the second direction D2.

An element isolation layer STI may be provided on the substrate 100. The element isolation layer STI may include an insulating material. For example, the element isolation layer STI may include an oxide. The element isolation layer STI may cover the substrate 100. The element isolation layer STI may cover the active region AR of the substrate 100. The active patterns AP may extend through the element isolation layer STI.

Source/drain patterns SD may be provided on the active patterns AP. In some example embodiments, the source/drain patterns SD may be P-type impurity regions. In some example embodiments, the source/drain patterns SD may be N-type impurity regions. The source/drain patterns SD may be epitaxial patterns formed through a selective epitaxial growth process. The source/drain patterns SD may include a semiconductor material. The source/drain patterns SD may extend in the second direction D2. The source/drain patterns SD may be arranged in the first direction D1. A portion of the active pattern AP may be provided between adjacent ones of the source/drain patterns SD in the first direction D1. The source/drain pattern SD may contact a plurality of active patterns AP. A plurality of active patterns AP arranged in the second direction D2 may contact one source/drain pattern SD. The source/drain pattern SD may extend across the active patterns AP. The active pattern AP may contact a plurality of source/drain patterns SD. A plurality of source/drain patterns SD arranged in the first direction D1 may contact one active pattern AP.

Gate structures GT may be provided on the active patterns AP. The gate structures GT may extend in the second direction D2. The gate structures GT may be arranged in the first direction D1. Each gate structure GT may cover side walls and top surfaces of the active patterns AP. The gate structure GT may be provided between adjacent ones of the source/drain patterns SD in the first direction D1. The source/drain pattern SD may be provided between adjacent ones of the gate structures GT in the first direction D1. The gate structure GT may extend across the active patterns AP.

Each gate structure GT may include a gate electrode GE, a gate insulating layer GI, gate spacers GS, and a gate capping layer GP. The gate electrode GE may extend in the second direction D2. The gate electrode GE may include a conductive material. The gate spacers GS may be provided at opposite sides of the gate electrode GE. The gate spacers GS may include an insulating material. The gate insulating layer GI may cover a side wall and a bottom surface of the gate electrode GE. The gate electrode GE may be spaced apart from the active pattern AP by the gate insulating layer GI. The gate electrode GE may be spaced apart from the gate spacer GS by the gate insulating layer GI. The gate capping layer GP may cover a top surface of the gate electrode GE. The gate capping layer GP may include an insulating material.

In some example embodiments, the semiconductor device may include a negative capacitance (NC) FET using a negative capacitor. For example, the gate insulating layer may include a ferroelectric material layer having ferroelectric characteristics, and a paraelectric material layer having paraelectric characteristics.

The ferroelectric material layer may have a negative capacitance, and the paraelectric material layer may have a positive capacitance. For example, when two or more capacitors are connected in series, and the capacitance of each of the capacitors has a positive value, the total capacitance of the capacitors may be lower than the capacitance of each individual capacitor. On the other hand, when at least one of the capacitances of two or more capacitors connected in series has a negative value, the total capacitance of the capacitors may have a positive value and may be greater than an absolute value of the capacitance of each individual capacitor.

When a ferroelectric material layer having a negative capacitance and a paraelectric material layer having a positive capacitance are connected in series, the total capacitance of the ferroelectric material layer and the paraelectric material layer connected in series may increase. A transistor including a ferroelectric material layer may have subthreshold swing (SS) of less than 60 mV/decade at normal temperature, using an increase in total capacitance as described above.

The ferroelectric material layer may have ferroelectric characteristics. The ferroelectric material layer may include, for example, at least one of hafnium oxide, hafnium zirconium oxide, barium strontium oxide, barium titanium oxide, or lead zirconium titanium oxide. Here, for example, hafnium zirconium oxide may be a material produced by doping hafnium oxide with zirconium (Zr). In another example, hafnium zirconium oxide may be a compound of hafnium (Hf), zirconium (Zr), and oxygen (O).

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The kind of the dopant included in the ferroelectric material layer may be varied in accordance with which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic % (at %) of aluminum. Here, the ratio of the dopant may be the ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric characteristics. The paraelectric material layer may include, for example, at least one of silicon oxide or a metal oxide having a high dielectric constant. The metal oxide included in the paraelectric material layer may include, for example, at least one of hafnium oxide, zirconium oxide, or aluminum oxide, without being limited thereto.

The ferroelectric material layer and the paraelectric material layer may include the same material. The ferroelectric material layer has ferroelectric characteristics, but the paraelectric material layer may not have ferroelectric characteristics. For example, when both the ferroelectric material layer and the paraelectric material layer include hafnium oxide, the crystalline structure of the hafnium oxide included in the ferroelectric material layer may differ from the crystalline structure of the hafnium oxide included in the paraelectric material layer.

The ferroelectric material layer may have a thickness exhibiting ferroelectric characteristics. The thickness of the ferroelectric material layer may be, for example, 0.5 to 10 nm, without being limited thereto. The critical thickness exhibiting ferroelectric characteristics may be varied in accordance with different ferroelectric materials and, as such, the thickness of the ferroelectric material layer may be varied in accordance with the ferroelectric material thereof.

For example, the gate insulating layer may include one ferroelectric material layer. In another example, the gate insulating layer may include a plurality of ferroelectric material layers spaced apart from one another. In this case, the gate insulating layer may have a stacked layer structure in which a plurality of ferroelectric material layers and a plurality of paraelectric material layers are alternately stacked.

A first insulating layer 110 covering the source/drain patterns SD may be provided. The first insulating layer 110 may include an insulating material. A second insulating layer 120 covering the first insulating layer 110 and the gate structures GT may be provided. The second insulating layer 120 may include an insulating material.

Active contacts AC extending through the first and second insulating layers 110 and 120 may be provided. The active contacts AC may be connected to the source/drain patterns SD, respectively. Each active contact AC may be provided between adjacent ones of the gate structures GT in the first direction D1. Each active contact AC may be provided between adjacent ones of the gate electrodes GE in the first direction D1. The active contacts AC may include a conductive material.

A gate contact GC extending through the second insulating layer 120 and the gate capping layer GP may be provided. The gate contact GC may be connected to the gate electrode GE. The gate contact GC may include a conductive material.

Referring to FIGS. 1B and 1E, each active pattern AP may include one base portion BA, and a plurality of protrusion portions PT on the base portion BA. The protrusion portions PT of the active pattern AP may be portions disposed at the same level as the source/drain patterns SD. In other words, the protrusion portions PT of the active pattern AP may be portions of the active pattern AP disposed at a higher level than bottom surfaces SD_B of the source/drain patterns SD. The protrusion portion PT of the active pattern AP may be disposed between the source/drain patterns SD. The source/drain patterns SD, which are adjacent to each other, may be spaced apart from each other in the first direction D1 by the protrusion portion PT of the active pattern AP. The base portion BA of the active pattern AP may be a portion disposed at a lower level than the source/drain patterns SD. In other words, the base portion BA of the active pattern AP may be portions of the active pattern AP disposed at a lower level than the bottom surfaces SD_B of the source/drain patterns SD. The level of a boundary BO between the protrusion portions PT and the base portion BA of the active pattern AP may be equal to the level of the bottom surface SD_B of the source/drain pattern SD. The protrusion portions PT may protrude from a top surface of the base portion BA in the third direction D3. The source/drain pattern SD may be provided on the base portion BA. The base portion BA may overlap a plurality of protrusion portions PT in the third direction D3. The base portion BA may overlap the plurality of source/drain patterns SD in the third direction D3.

The protrusion portion PT of the active pattern AP may include first to fourth flat pattern portions FP1, FP2, FP3 and FP4, and first to third curved pattern portions CP1, CP2 and CP3. The first flat pattern portion FP1, the first curved pattern portion CP1, the second flat pattern portion FP2, the second curved pattern portion CP2, the third flat pattern portion FP3, the third curved pattern portion CP3, and the fourth flat pattern portion FP4 may be sequentially provided on the base portion BA in the third direction D3. The third curved pattern portion CP3 may be provided at a lower level than the fourth flat pattern portion FP4. The third flat pattern portion FP3 may be provided at a lower level than the third curved pattern portion CP3. The second curved pattern portion CP2 may be provided at a lower level than the third flat pattern portion FP3. The second flat pattern portion FP2 may be provided at a lower level than the second curved pattern portion CP2. The first curved pattern portion CP1 may be provided at a lower level than the second flat pattern portion FP2. The first flat pattern portion FP1 may be provided at a lower level than the first curved pattern portion CP1. The base portion BA may be provided at a lower level than the first flat pattern portion FP1.

The fourth flat pattern portion FP4 may be an uppermost portion of the protrusion portion PT of the active pattern AP. The flat pattern portions FP1, FP2, FP3 and FP4 and the curved pattern portions CP1, CP2 and CP3 of the protrusion portion PT may be alternately provided in the third direction D3.

The first to fourth flat pattern portions FP1, FP2, FP3 and FP4 and the first to third curved pattern portions CP1, CP2 and CP3 of the protrusion portion PT may be disposed between adjacent ones of the source/drain patterns SD in the first direction D1. Although the number of the flat pattern portions FP1, FP2, FP3 and FP4 is shown and described as being four, example embodiments of the disclosure are not limited thereto. In some example embodiments, the number of flat pattern portions may be three or less, or may be five or more. Although the number of the curved pattern portions CP1, CP2 and CP3 is shown and described as being three, example embodiments are not limited thereto. In some example embodiments, the number of curved pattern portions may be two or less, or may be four or more.

The first to fourth flat pattern portions FP1, FP2, FP3 and FP4 of the protrusion portion PT may have a flat side wall. For example, the entirety of a side wall FP4_S of the fourth flat pattern portion FP4 extending in the first direction D1 may be flat. The curved pattern portions CP1, CP2 and CP3 of the protrusion portion PT may have a curved side wall. For example, the entirety of a side wall CP3_S of the third curved pattern portion CP3 extending in the first direction D1 may be curved. The gate insulating layer GI and the gate electrode GE of the gate structure GT may include curved portions corresponding to the side walls of the first to third curved pattern portions CP1, CP2 and CP3.

The minimum width of one of the flat pattern portions FP1, FP2, FP3 and FP4 may be greater than the minimum widths of the curved pattern portions CP1, CP2 and CP3 adjacent to the flat pattern portions FP1, FP2, FP3 and FP4. For example, when the width in the second direction D2 of the third flat pattern portion FP3 is defined as a first width W1, the width in the second direction D2 of the third curved pattern portion CP3 adjacent to the third flat pattern portion FP3 is defined as a second width W2, and the width in the second direction D2 of the second curved pattern portion CP2 adjacent to the third flat pattern portion FP3 is defined as a third width W3, the minimum value of the first width W1 may be greater than the minimum value of the second width W2 and the minimum value of the third width W3. The width in the second direction D2 of the second flat pattern portion FP2 may be defined as a fourth width W4, and the minimum value of the fourth width W4 may be greater than the minimum value of the third width W3.

The curved pattern portions CP1, CP2 and CP3 may have minimum widths at centers thereof, respectively. For example, the second width W2 of the third curved pattern portion CP3 in the second direction D2 may be minimized at the center of the third curved pattern portion CP3 in the third direction D3. The third width W3 of the second curved pattern portion CP2 the second direction D2 may be minimized at the center of the second curved pattern portion CP2 in the third direction D3. The curved pattern portions CP1, CP2 and CP3 may have widths gradually increasing as the curved pattern portions CP1, CP2 and CP3 extend from the centers thereof toward the flat pattern portions FP1, FP2, FP3 and FP4, respectively, in the third direction D3. For example, the second width W2 of the third curved pattern portion CP3 may gradually increase as the third curved pattern portion CP3 extends from the center thereof toward the fourth flat pattern portion FP4 or the third flat pattern portion FP3 in the third direction D3, and the third width W3 of the second curved pattern portion CP2 may gradually increase as the second curved pattern portion CP2 extends from the center thereof toward the third flat pattern portion FP3 or the second flat pattern portion FP2 in the third direction D3.

The first to third curved pattern portions CP1, CP2 and CP3 may be disposed at the same level as the source/drain patterns SD. In other words, the first to third curved pattern portions CP1, CP2 and CP3 may be disposed at a higher level than the bottom surface SD_B of the source/drain pattern SD while being disposed at a lower level than a top surface SD_T of the source/drain pattern SD.

The first to fourth flat pattern portions FP1, FP2, FP3 and FP4 may be disposed at the same level as the source/drain patterns SD. In other words, the first to fourth flat pattern portions FP1, FP2, FP3 and FP4 may be disposed at a higher level than the bottom surface SD_B of the source/drain pattern SD while being disposed at a lower level than the top surface SD_T of the source/drain pattern SD.

A plurality of source/drain patterns SD may be provided on the base portion BA of the active pattern AP. The base portion BA may have a flat side wall. For example, the entirety of a side wall BA_S of the base portion BA extending in the first direction D1 may be flat.

Referring to FIG. 1F, the active pattern AP may include silicon-germanium. Of course, a material included in the active pattern AP is not limited to silicon-germanium, and may be another semiconductor material.

The germanium concentration in the active pattern AP may gradually increase at a higher level of the active pattern AP. The germanium concentration of the protrusion portion PT may be higher than the germanium concentration of the base portion BA. The germanium concentration may gradually decrease in an order of the fourth flat pattern portion FP4, the third curved pattern portion CP3, the third flat pattern portion FP3, the second curved pattern portion CP2, the second flat pattern portion FP2, the first curved pattern portion CP1, the first flat pattern portion FP1, and the base portion BA. For example, the germanium concentration of the fourth flat pattern portion FP4 may be higher than the germanium concentration of the third curved pattern portion CP3 disposed at a lower level than the fourth flat pattern portion FP4, and the germanium concentration of the third curved pattern portion CP3 may be higher than the germanium concentration of the third flat pattern portion FP3 disposed at a lower level than the third curved pattern portion CP3. The germanium concentration of the active pattern AP may continuously decrease as the active pattern AP extends from the fourth flat pattern portion FP4 toward the base portion BA.

In the semiconductor device according to the example embodiments of the disclosure, a short channel effect may be alleviated as the active pattern AP includes the curved pattern portions CP1, CP2 and CP3.

In the semiconductor device according to the example embodiments of the disclosure, no quantum well structure may be formed between the flat pattern portion and the curved pattern portion as the germanium concentration of the active pattern AP varies continuously, and as such a flow of current may be enhanced.

FIGS. 2, 3, 4, 5, 6, 7, 8A, 8B, 8C, 9A, 9B, 9C, 10A, 10B, 10C, 11A, 11B and 11C are views explaining a method for manufacturing a semiconductor device in accordance with some example embodiments of the disclosure.

Figure 2:
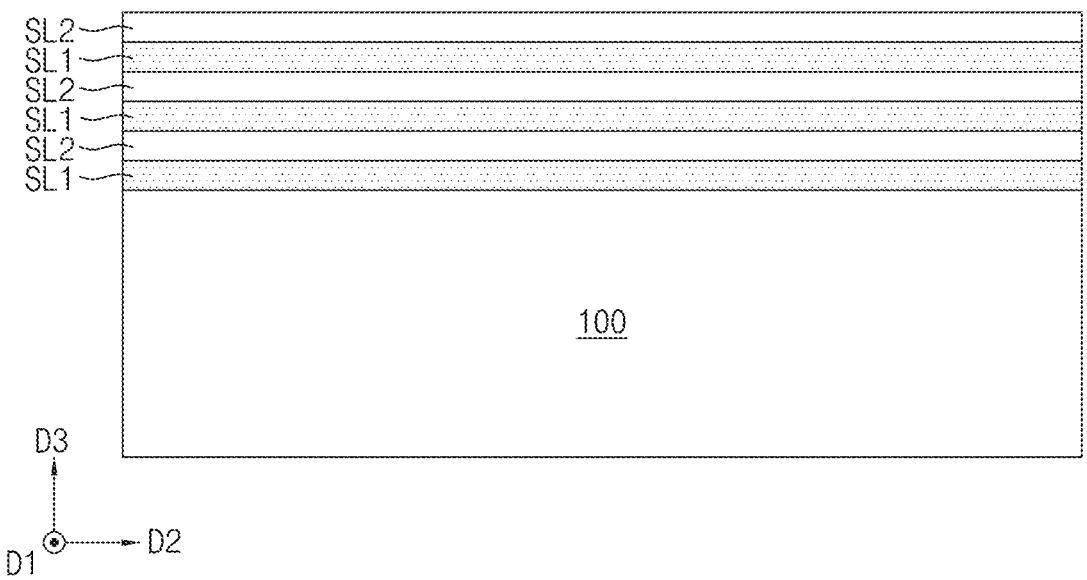
FIGS. 2, 3, 4, 5, 6, 7, 8A, 8B, 8C, 9A, 9B, 9C, 10A, 10B, 10C, 11A, 11B and 11C are views explaining a method for manufacturing a semiconductor device in accordance with some example embodiments of the disclosure.

Referring to FIG. 2, a substrate 100 may be formed. Thereafter, first semiconductor layers SL1 and second semiconductor layers SL2 may be alternately formed on the substrate 100 in a third direction D3. For example, the first semiconductor layers SL1 may include silicon-germanium (SiGe), and the second semiconductor layers SL2 may include silicon (Si).

Figure 3:
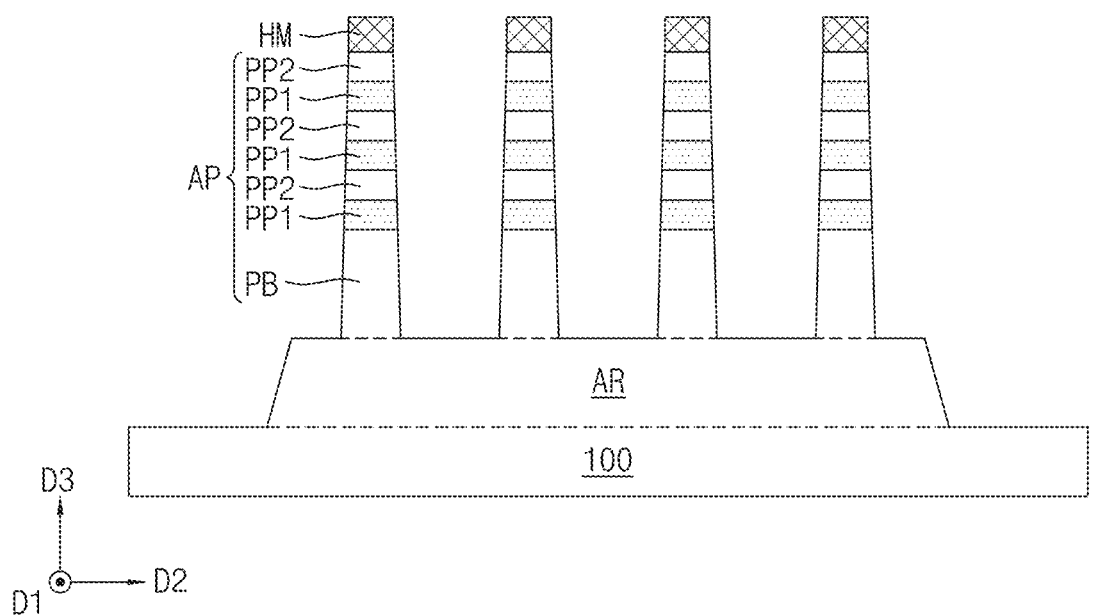

Referring to FIG. 3, an active region AR and active patterns AP may be formed. Each active pattern AP may include a preliminary base portion PB, first preliminary pattern portions PP1, and second preliminary pattern portions PP2. The first preliminary pattern portions PP1 and the second preliminary pattern portions PP2 may be alternately provided on the preliminary base portion PB in the third direction D3.

Formation of the active pattern AP may include forming a hard mask layer HM including an opening, and patterning the first semiconductor layers SL1, the second semiconductor layers SL2 and the substrate 100 using the hard mask layer HM as an etch mask. As the substrate 100 is patterned, the preliminary base portion PB may be formed. As the first semiconductor layer SL1 is patterned, the first preliminary pattern portion PP1 may be formed. As the second semiconductor layer SL2 is patterned, the second preliminary pattern portion PP2 may be formed. Formation of the active region AR may include etching the substrate 100. The hard mask layer HM may include an insulating material. For example, the hard mask layer HM may include silicon nitride.

Figure 4:
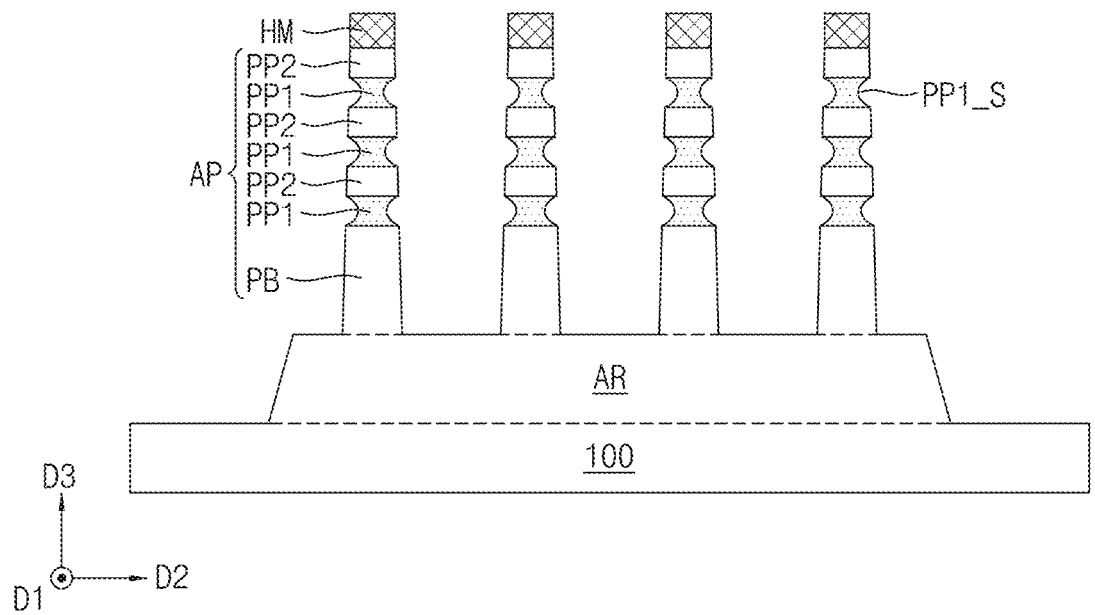

Referring to FIG. 4, the first preliminary pattern portions PP1 may be etched. For example, the first preliminary pattern portions PP1 may be etched through an isotropic etching process. The first preliminary pattern portions PP1 may be selectively etched. For example, when the first preliminary pattern portions PP1 include silicon-germanium, the first preliminary pattern portions PP1 may be etched using an etching material capable of selectively etching silicon-germanium.

The etched first preliminary pattern portion PP1 may have a curved side wall. For example, a side wall PP1_S of the etched first preliminary pattern portion PP1 extending in a first direction D1 may be curved. The etched first preliminary pattern portion PP1 may have a minimum width at a center thereof in the third direction D3. For example, the width of the etched first preliminary pattern portion PP1 in a second direction D2 may be minimized at the center of the etched first preliminary pattern portion PP1 in the third direction D3. The etched first preliminary pattern portion PP1 may have a width gradually increasing as the etched first preliminary pattern portion PP1 extends from the center thereof toward the second preliminary pattern portion PP2 in the third direction D3. For example, the width of the etched first preliminary pattern portion PP1 in the second direction D2 may gradually increase as the etched first preliminary pattern portion PP1 extends from the center thereof toward the second preliminary pattern portion PP2 in the third direction D3.

Figure 5:
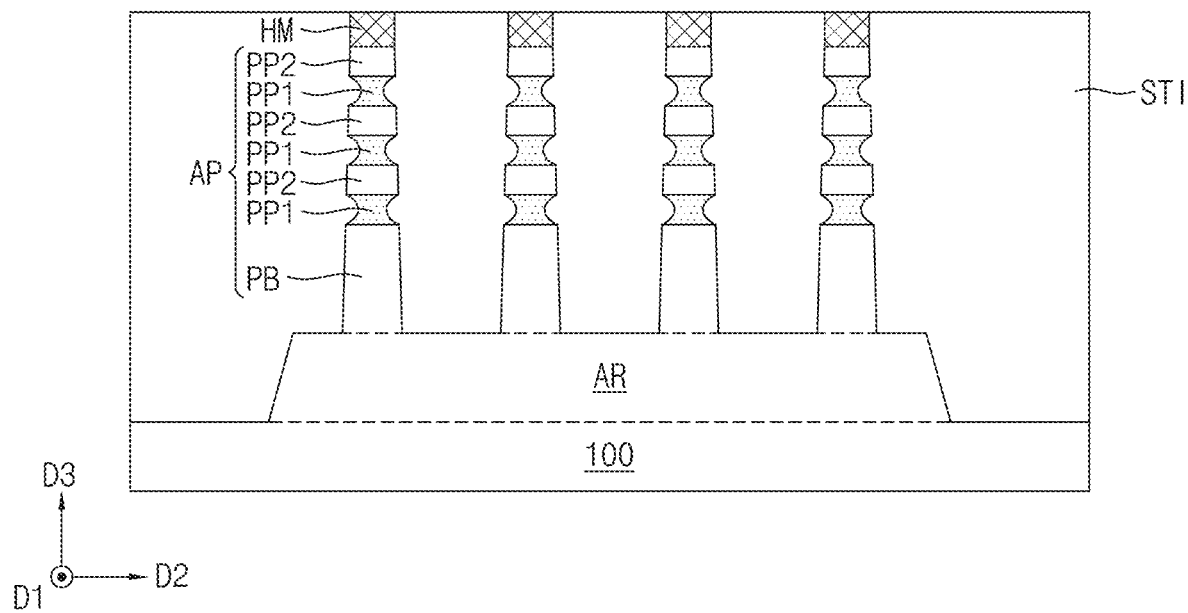

Referring to FIG. 5, an element isolation layer STI may be formed. The element isolation layer STI may cover the substrate 100, the active region AR, the active patterns AP, and the hard mask layer HM.

Figure 6:
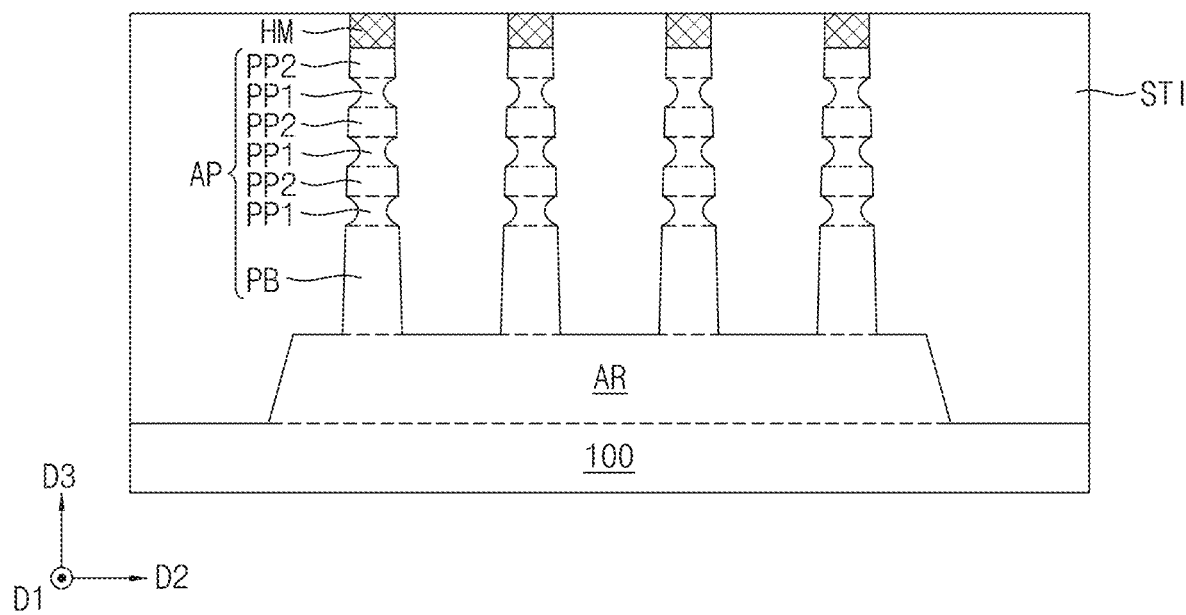

Referring to FIG. 6, an annealing process may be performed. In accordance with the annealing process, germanium in the first preliminary pattern portions PP1 may be diffused into the second preliminary pattern portions PP2. In accordance with the annealing process, germanium in the first preliminary pattern portions PP1 may be diffused into the preliminary base portion PB.

In accordance with the annealing process, germanium concentrations in the preliminary base portion PB, the first preliminary pattern portions PP1 and the second preliminary pattern portions PP2 of the active pattern AP may be continuously varied. In other words, germanium concentrations at boundaries among the preliminary base portion PB, the first preliminary pattern portions PP1 and the second preliminary pattern portions PP2 of the active pattern AP may not be discontinuously varied. In accordance with the annealing process, the germanium concentration of the active pattern AP may gradually decrease as the active pattern AP extends downwards from an uppermost one of the second preliminary pattern portions PP2.

Figure 7:
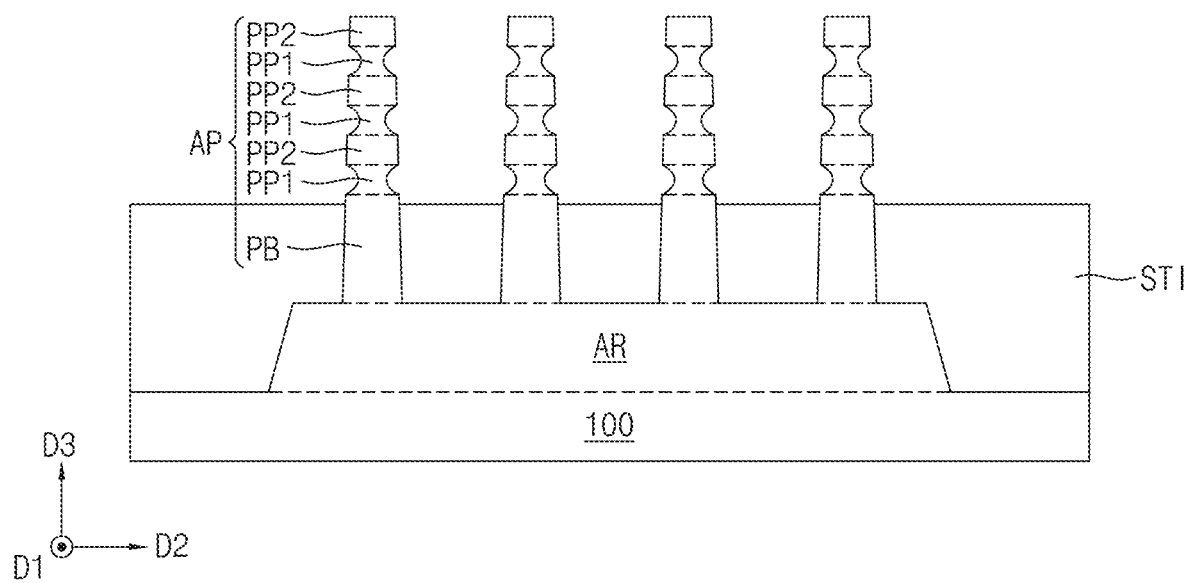

Referring to FIG. 7, the hard mask layer HM and an upper portion of the element isolation layer STI may be removed. As the hard mask layer HM and the upper portion of the element isolation layer STI are removed, the active patterns AP may be exposed. As the hard mask layer HM and the upper portion of the element isolation layer STI are removed, the first preliminary pattern portions PP1, the second preliminary pattern portions PP2, and an upper portion of the preliminary base portion PB may be exposed.

Figure 8A:
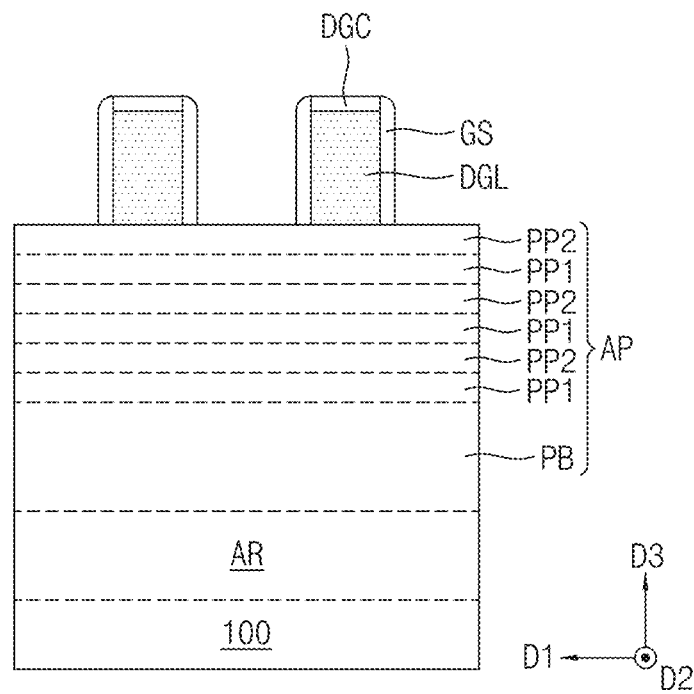
Figure 8B:
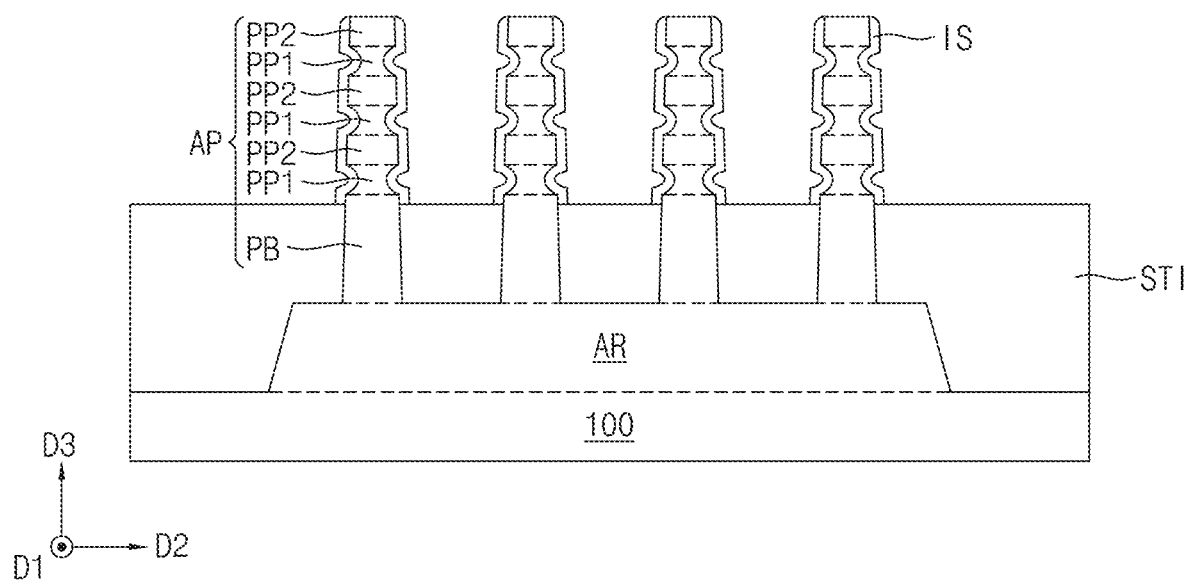
Figure 8C:
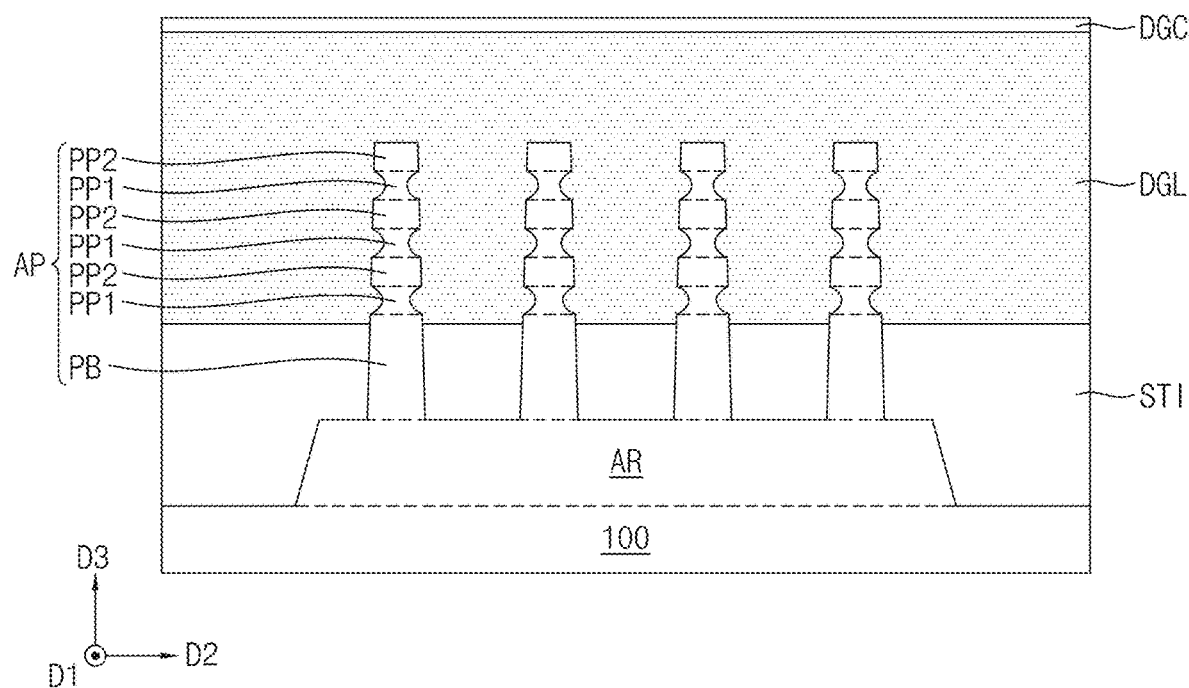

Referring to FIGS. 8A, 8B and 8C, dummy gate lines DGL, dummy capping layers DGC, gate spacers GS, and insulating spacers IS may be formed. The dummy gate lines DGL and the dummy gate capping layers DGC may extend in the second direction D2. The dummy gate line DGL may be formed on the active pattern AP and the element isolation layer STI, and the dummy gate capping layer DGC may be formed on the dummy gate line DGL. For example, the dummy gate line DGL may include polysilicon, and the dummy gate capping layer DGC may include an insulating material.

Formation of the gate spacer GS and the insulating spacer IS may include forming a spacer layer covering the active pattern AP, the dummy gate line DGL and the dummy gate capping layer DGC, and anisotropically etching the spacer layer. As the spacer layer is anisotropically etched, the spacer layer may be separated into gate spacers GS and insulating spacers IS. The gate spacers GS and the insulating spacers IS may include an insulating material. For example, the gate spacers GS and the insulating spacers IS may include silicon oxide.

Figure 9A:
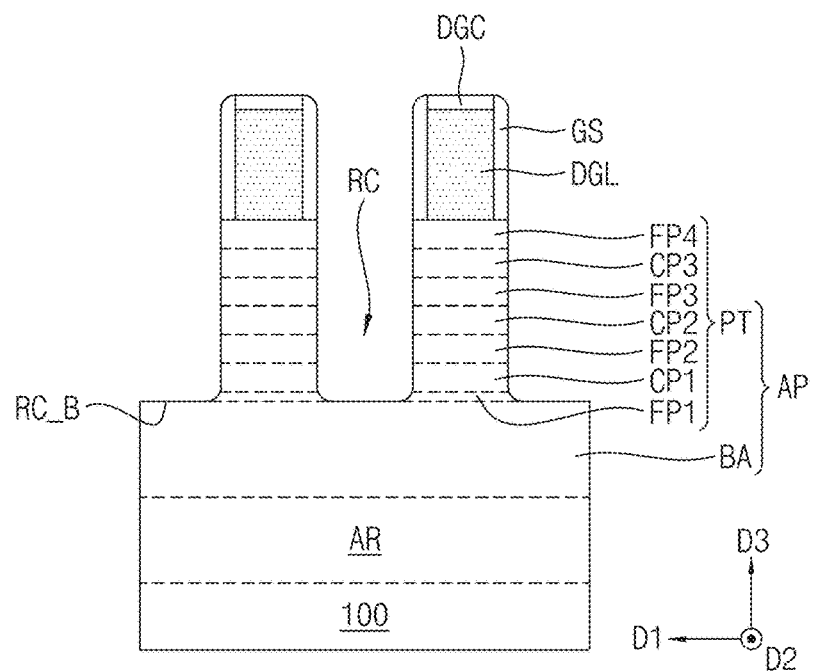
Figure 9B:
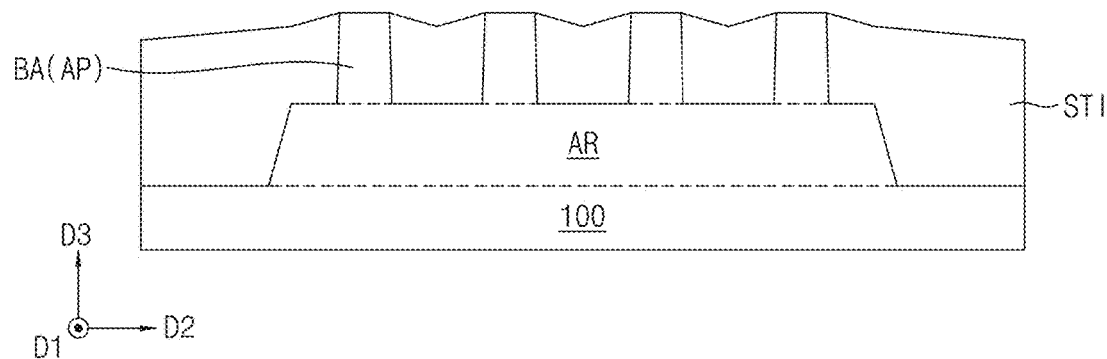
Figure 9C:
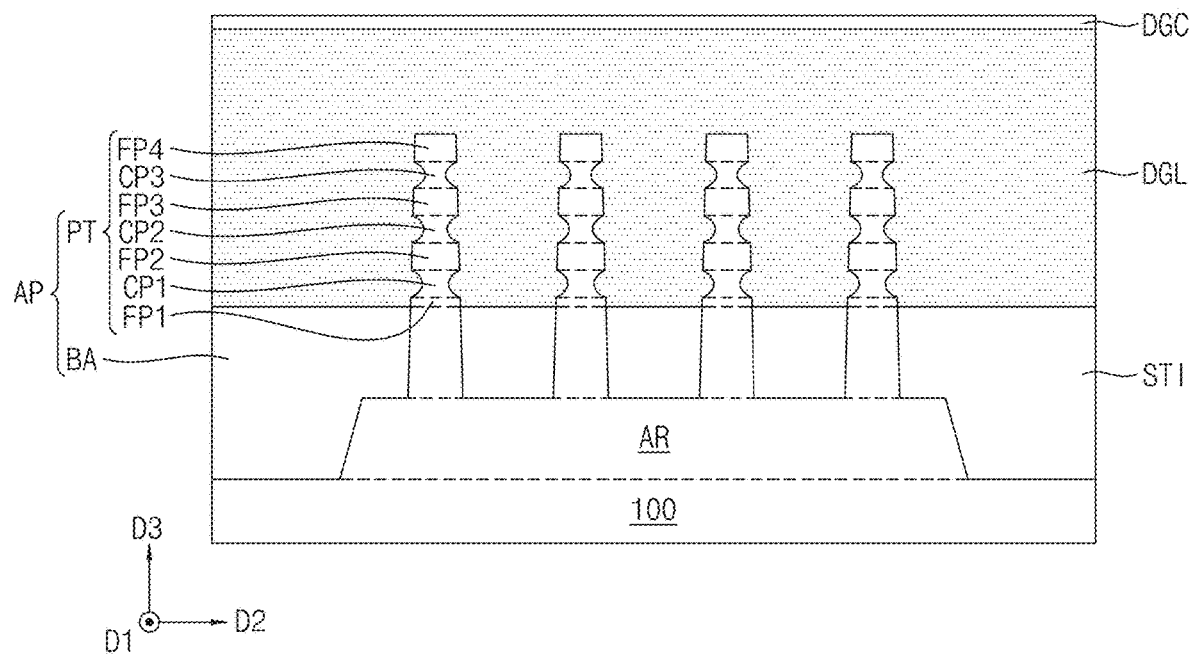

Referring to FIGS. 9A, 9B and 9C, the active patterns AP may be etched. The active patterns AP, which are exposed through the dummy gate lines DGL, the dummy gate capping layers DGC and the gate spacers GS, may be etched, thereby forming recesses RC. As the active patterns AP are etched, the insulating spacers IS may be removed. In some example embodiments, the insulating spacers IS may be removed before etching of the active patterns AP.

As the active pattern AP is etched, a base portion BA and protrusion portions PT may be formed. The level of a boundary between the protrusion portion PT and the base portion BA may be equal to the level of a bottom surface RC_B of the recess RC. The protrusion portion PT may be disposed at the same level as the recess RC. The base portion BA may be disposed at a lower level than the recess RC.

Each of the first preliminary pattern portions PP1 may be etched and, as such, may be divided into a plurality of portions. The divided portions of the first pattern portions PP1 may be defined as first to third curved pattern portions CP1, CP2 and CP3. Each of the second preliminary pattern portions PP2 may be etched and, as such, may be divided into a plurality of portions. The divided portions of the second preliminary pattern portions PP2 may be defined as second to fourth flat pattern portions FP2, FP3 and FP4. The upper portion of the preliminary base portion PB may be etched, thereby forming the base portion BA and first flat pattern portions FP1.

Figure 10A:
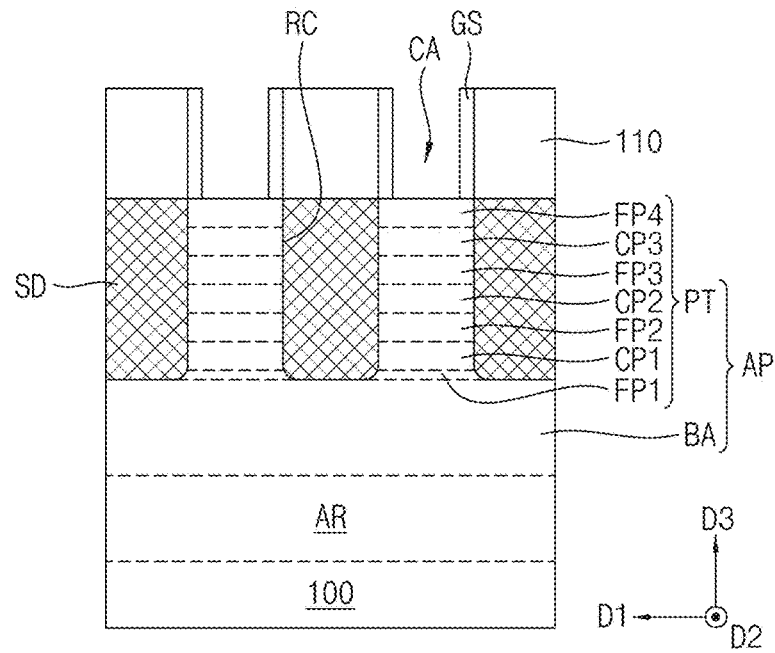
Figure 10B:
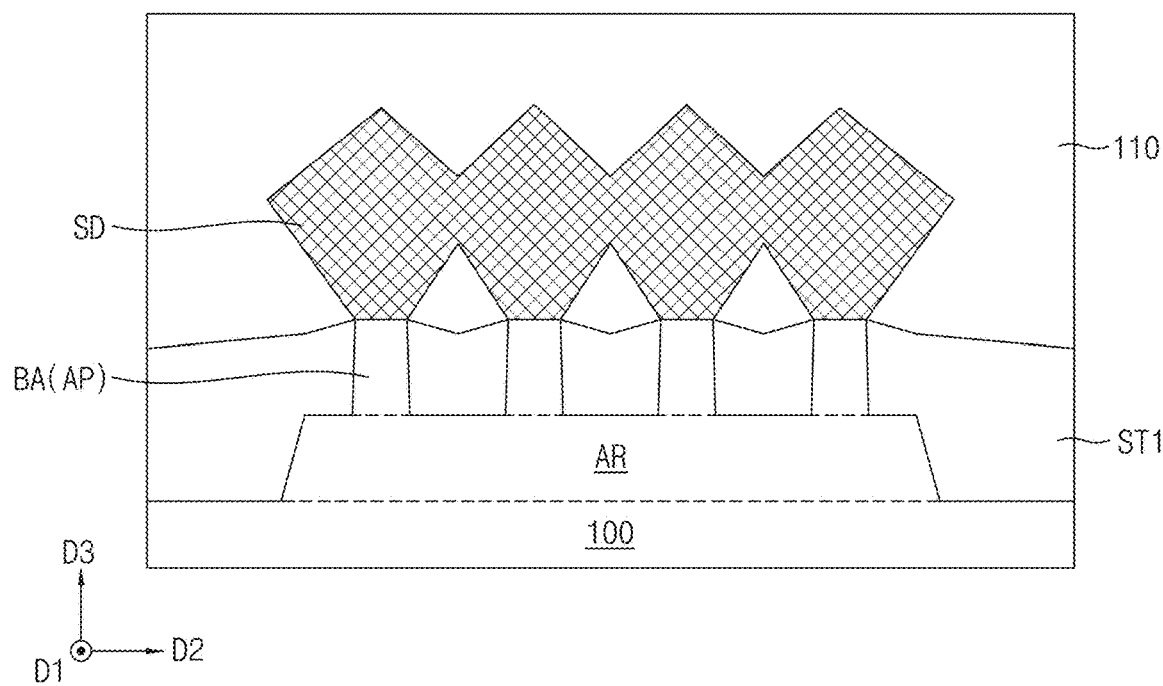
Figure 10C:
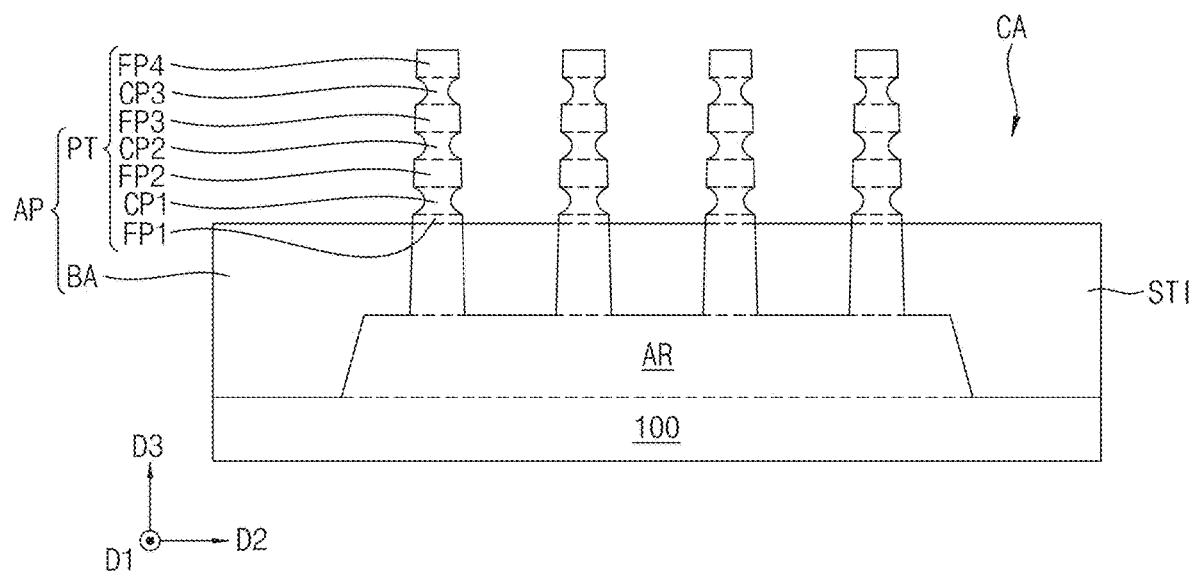

Referring to FIGS. 10A, 10B and 10C, source/drain patterns SD may be formed. Formation of the source/drain patterns SD may include forming source/drain patterns SD in the recesses RC using an epitaxial growth process.

Subsequently, a first insulating layer 110 covering the source/drain patterns SD may be formed.

Thereafter, the dummy gate lines DGL and the dummy gate capping layers DGC may be removed. In an example embodiment, the dummy gate capping layers DGC may be removed through a planarization process. In an embodiment, the dummy gate lines DGL may be removed through a selective etching process.

As the dummy gate capping layers DGC and the dummy gate lines DGL are removed, cavities CA may be formed among the gate spacers GS, respectively. The cavity CA may extend in the second direction D2.

Figure 11A:
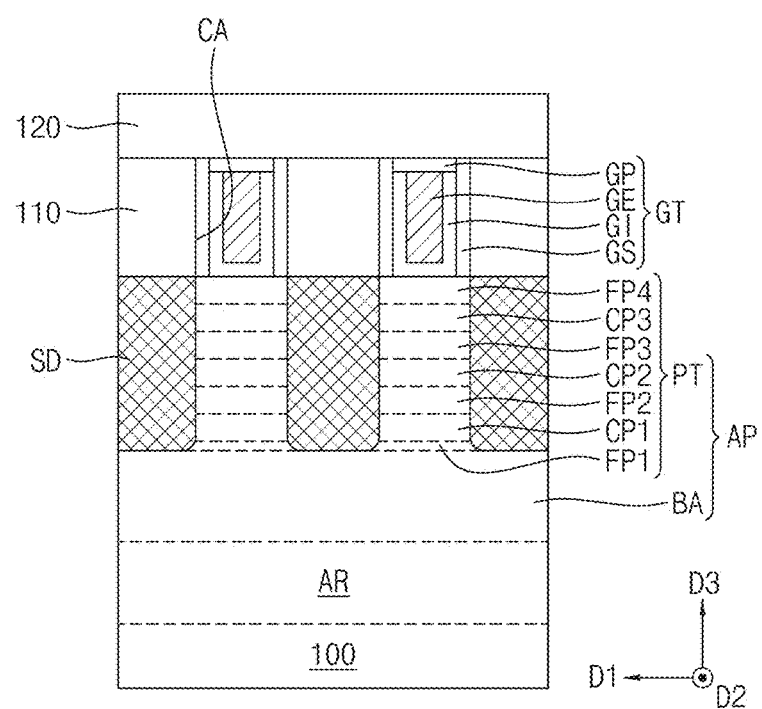
Figure 11B:
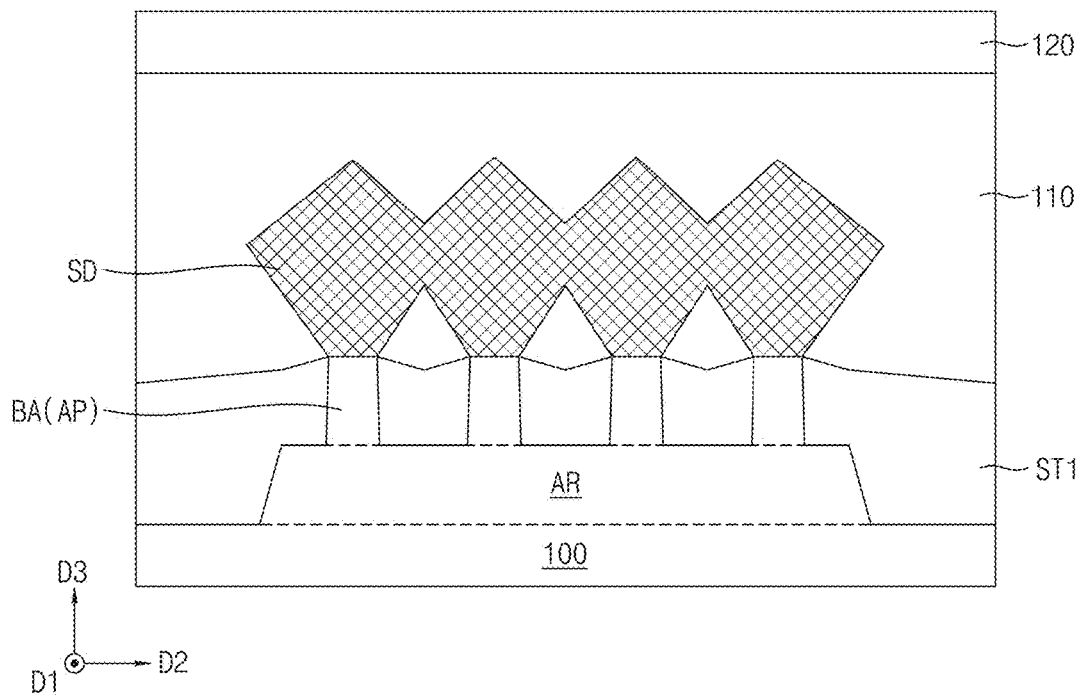
Figure 11C:
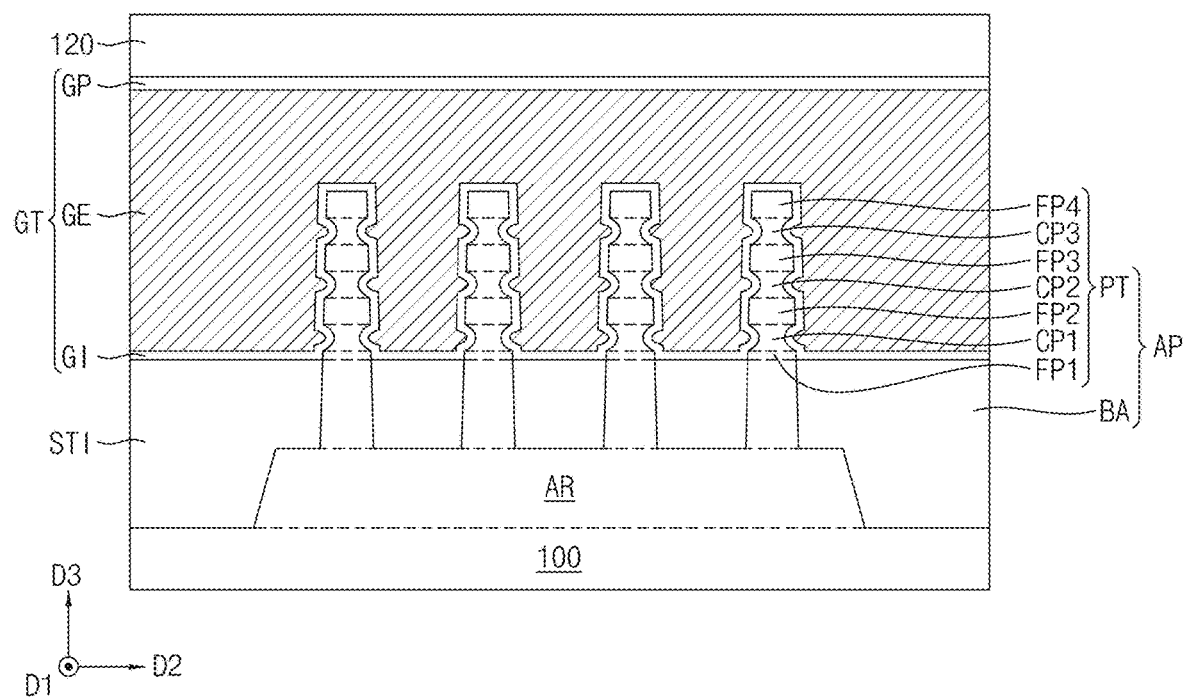

Referring to FIGS. 11A, 11B and 11C, gate insulating layers GI, gate electrodes GE, and gate capping layers GP may be formed. The gate insulating layer GI, the gate electrode GE and the gate capping layer GP may be sequentially formed in the cavity CA. As the gate insulating layer GI, the gate electrode GE and the gate capping layer GP are formed, a gate structure GT, which includes the insulating layer GI, the gate electrode GE, the gate capping layer GP and the gate spacer GS, may be defined.

Thereafter, a second insulating layer 120 covering the first insulating layer 110, the gate spacers GS and the gate capping layers GP may be formed.

Referring to FIGS. 1B, 1C and 1D, active contacts AC extending through the first insulating layer 110 and the second insulating layer 120 may be formed. A gate contact GC extending through the second insulating layer 120 and the gate capping layer GP may be formed.

Figure 12A:
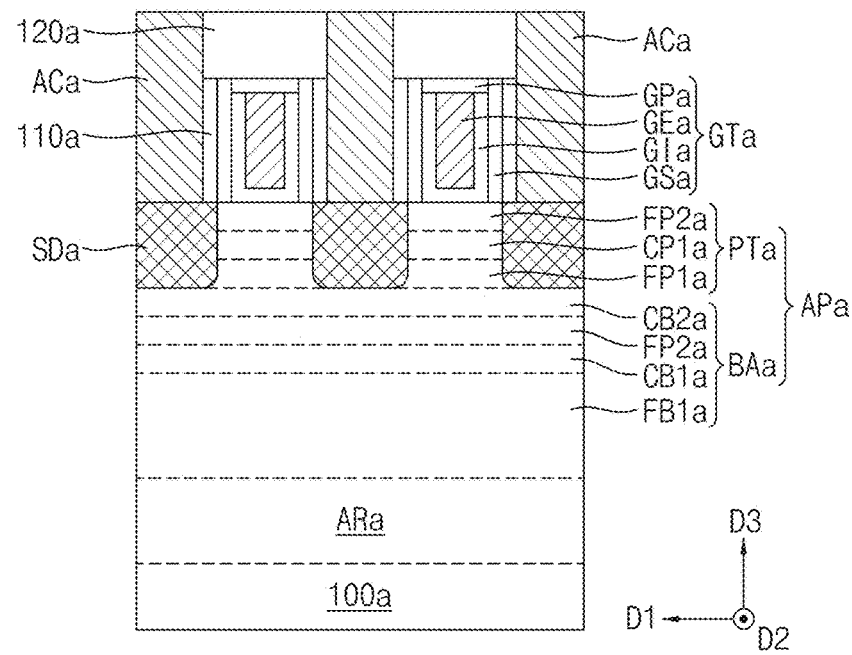
FIGS. 12A, 12B and 12C are cross-sectional views of a semiconductor device according to some example embodiments of the disclosure.
Figure 12B:
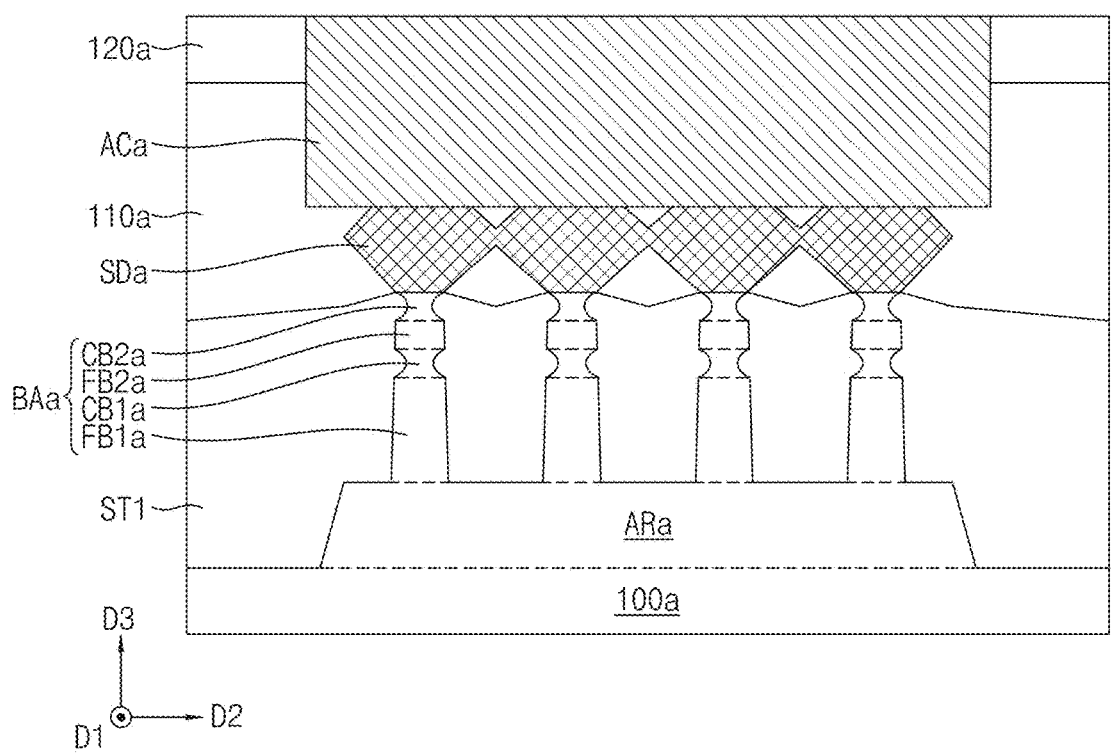
Figure 12C:
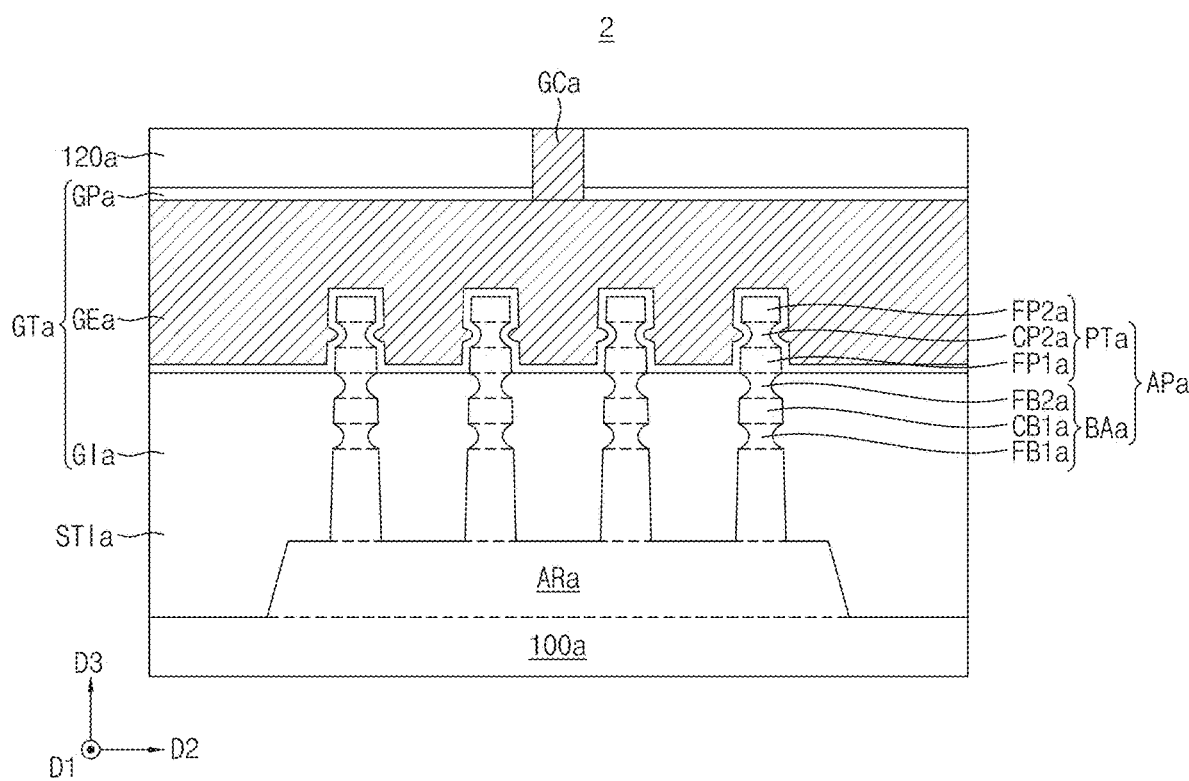

FIGS. 12A, 12B and 12C are cross-sectional views of a semiconductor device according to some example embodiments of the disclosure.

Referring to FIGS. 12A, 12B and 12C, a semiconductor device 2 may include a substrate 100a including an active region ARa. An element isolation layer STIa covering the substrate 100a may be provided. Active patterns APa may be provided on the active region ARa.

A source/drain pattern SDa and a gate structure GTa may be provided on the active patterns APa. The gate structure GTa may include a gate insulating layer GIa, a gate electrode GEa, and a gate capping layer GPa. A first insulating layer 110a covering the source/drain pattern SDa may be provided. A second insulating layer 120a may be provided on the first insulating layer 110a and the gate capping layer GPa. An active contact ACa extending through the first and second insulating layers 110a and 120a may be provided. A gate contact GCa extending through the second insulating layer 120a and the gate capping layer GPa may be provided.

The active pattern APa may include a base portion BAa and a plurality of protrusion portions PTa. The base portion BAa may include a first flat base portion FB1a, a first curved base portion CB1a, a second flat base portion FB2a, and a second curved base portion CB2a sequentially provided in a third direction D3. Each of the protrusion portions PTa may include a first flat pattern portion FP1a, a first curved pattern portion CP1a, and a second flat pattern portion FP2a sequentially provided in the third direction D3. The first and second flat base portions FB1a and FB2a may have a flat side wall. The first and second curved base portions CB1a and CB2a may have a curved side wall.

The first flat base portion FB1a, the first curved base portion CB1a, the second flat base portion FB2a, and the second curved base portion CB2a may be disposed at a lower level than the source/drain pattern SDa. The first flat pattern portion FP1a, the first curved pattern portion CP1a, and the second flat pattern portion FP2a may be disposed at the same level as the source/drain pattern SDa.

The first flat base portion FB1a, the first curved base portion CB1a, the second flat base portion FB2a, and the second curved base portion CB2a may be disposed in the element isolation layer STIa. Each of the first flat base portion FB1a, the first curved base portion CB1a, the second flat base portion FB2a, and the second curved base portion CB2a may overlap a plurality of protrusion portions PTa in the third direction D3. For example, each of the first flat base portion FB1a, the first curved base portion CB1a, the second flat base portion FB2a, and the second curved base portion CB2a may vertically overlap the plurality of protrusion portions PTa. Each of the first flat base portion FB1a, the first curved base portion CB1a, the second flat base portion FB2a, and the second curved base portion CB2a may overlap a plurality of first flat pattern portions FP1a, a plurality of first curved pattern portions CP1a and a plurality of second flat pattern portions FP2a in the third direction D3. Each of the first flat base portion FB1a, the first curved base portion CB1a, the second flat base portion FB2a, and the second curved base portion CB2a may overlap a plurality of source/drain patterns SDa in the third direction D3.

The width of each of the first flat base portion FB1a, the first curved base CB1a, the second flat base FB2a, and the second curved base CB2a in a first direction D1 may be greater than the sum of widths of the plurality of protrusions PTa in the first direction D1. The width of each of the first flat base FB1a, the first curved base CB1a, the second flat base FB2a, and the second curved base CB2a in the first direction D1 may be greater than the sum of widths of the plurality of source/drain patterns SDa in the first direction D1.

Although the first flat base FB1a, the first curved base CB1a, the second flat base FB2a, and the second curved base CB2a are shown and described as being disposed at a lower level than the source/drain pattern SDa, the number of flat bases and curved bases disposed at a lower level than the source/drain pattern SDa is not limited thereto.

Figure 13:
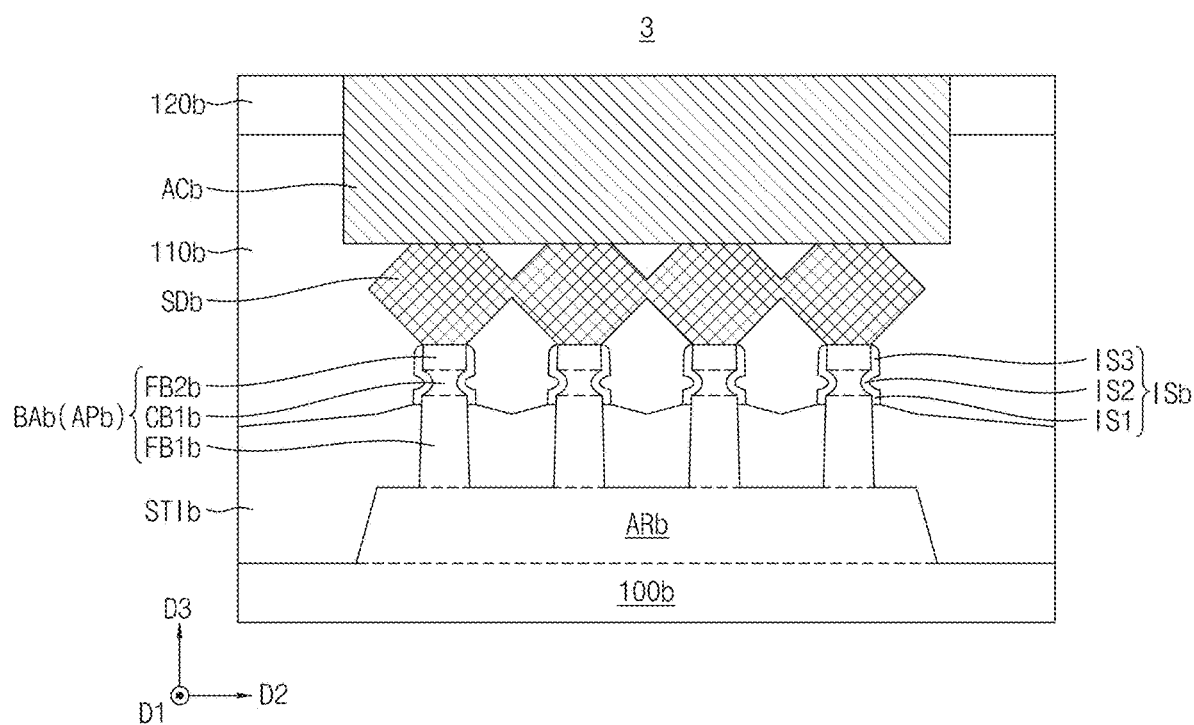
FIG. 13 is a cross-sectional view of a semiconductor device according to some example embodiments of the disclosure.

FIG. 13 is a cross-sectional view of a semiconductor device according to some example embodiments of the disclosure.

Referring to FIG. 13, a semiconductor device 3 may include a substrate 100b including an active region ARb. An element isolation film STIb covering the substrate 100b may be provided. Active patterns APb may be provided on the active region ARb.

A source/drain pattern SDb may be provided on the active patterns APb. A first insulating film 110b covering the source/drain pattern SDb may be provided. A second insulating film 120b may be provided on the first insulating film 110b. An active contact ACb extending through the first and second insulating films 110b and 120b may be provided.

The active pattern APb may include a base portion BAb. The base portion BAb may include a first flat base portion FB1b, a first curved base portion CB1b, and a second flat base portion FB2b sequentially provided in a third direction D3. Each of the first flat base portion FB1b, the first curved base portion CB1b, and the second flat base portion FB2b may overlap a plurality of source/drain patterns SDb in the third direction D3. The first flat base portion FB1b, the first curved base portion CB1b, and the second flat base portion FB2b may be disposed at a lower level than the source/drain pattern SDb. The first curved base portion CBlb and the second flat base portion FB2b may be disposed at a higher level than the element isolation layer STIb.

An insulating spacer ISb may be provided on side walls of the first flat base portion FB1b, the first curved base portion CB1b, and the second flat base portion FB2b. The insulating spacer ISb may include a first portion IS1 on the side wall of the first flat base portion FB1b, a second portion IS2 on the side wall of the first curved base portion CB1b, and a third portion IS3 on the side wall of the second flat base portion FB2b.

An inner side wall of the first portion IS1 of the insulating spacer ISb may be flat corresponding to the side wall of the first flat base portion FBlb. An inner side wall of the second portion IS2 of the insulating pacer ISb may be curved corresponding to the side wall of the first curved base portion CBlb. An inner side wall of the third portion IS3 of the insulating spacer ISb may be flat corresponding to the side wall of the second flat base portion FB2b. Here, side walls of the first to third portions IS1, IS2 and IS3 of the insulating spacer ISb contacting the base portion BAb may be defined as inner side walls.

Figure 14:
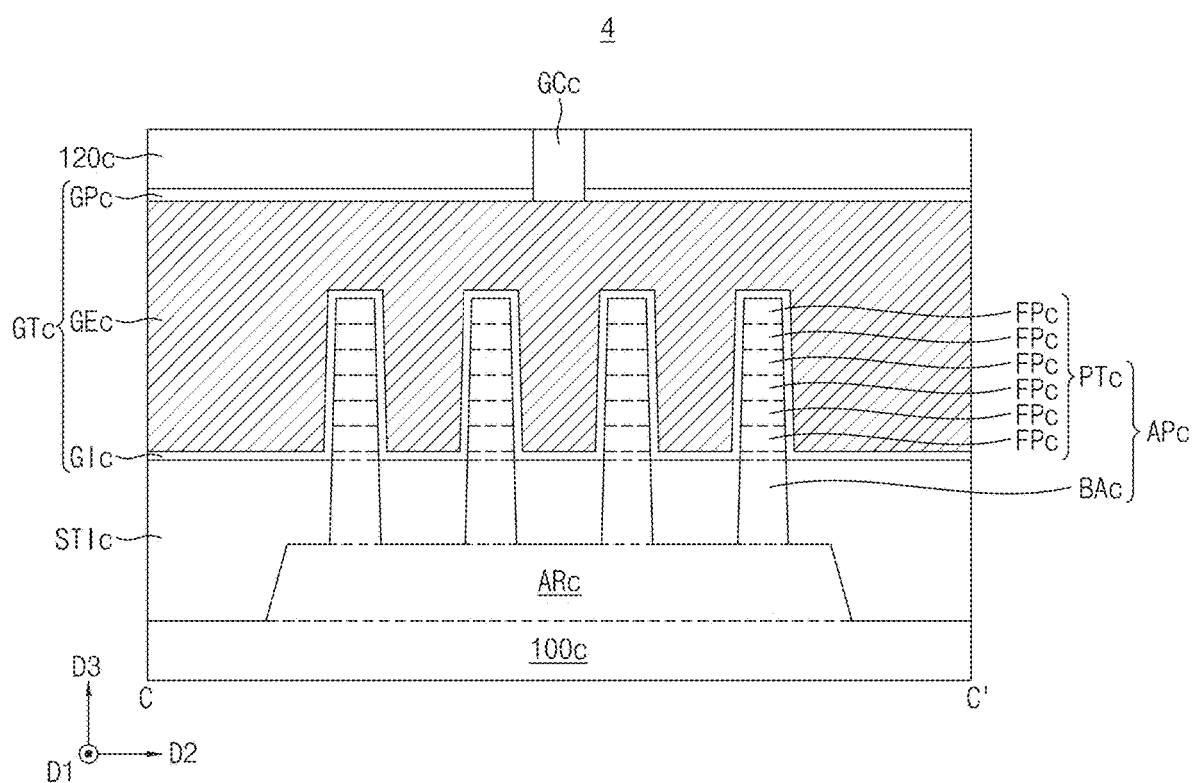
FIG. 14 is a cross-sectional view explaining a semiconductor device according to some example embodiments of the disclosure.

FIG. 14 is a cross-sectional view explaining a semiconductor device according to some example embodiments of the disclosure.

Referring to FIG. 14, a semiconductor device 4 may include a substrate 100c including an active region ARc. An element isolation layer STIc covering the substrate 100c may be provided. A plurality of active patterns APc may be provided on the active region ARc.

A gate structure GTc may be provided on the active patterns APc. The gate structure GTc may include a gate insulating layer GIc, a gate electrode GEc, and a gate capping layer GPc.

An insulating layer 120c covering the gate capping layer GPc may be provided. A gate electrode GCc extending through the insulating layer 120c and the gate capping layer GPc may be provided.

The active pattern APc may include a base portion BAc and a plurality of protrusion portions PTc. The protrusion portion PTc may include a plurality of flat pattern portions FPc overlapping one another in a third direction D3. The plurality of flat pattern portions FPc included in one protrusion portion PTc may include silicon-germanium. The plurality of flat pattern portions FPc included in one protrusion portion PTc may have different germanium concentrations. For example, the lower the level at which the flat pattern portion FPc is disposed, the lower the germanium concentration of the flat pattern portion FPc may be.

Figure 15:
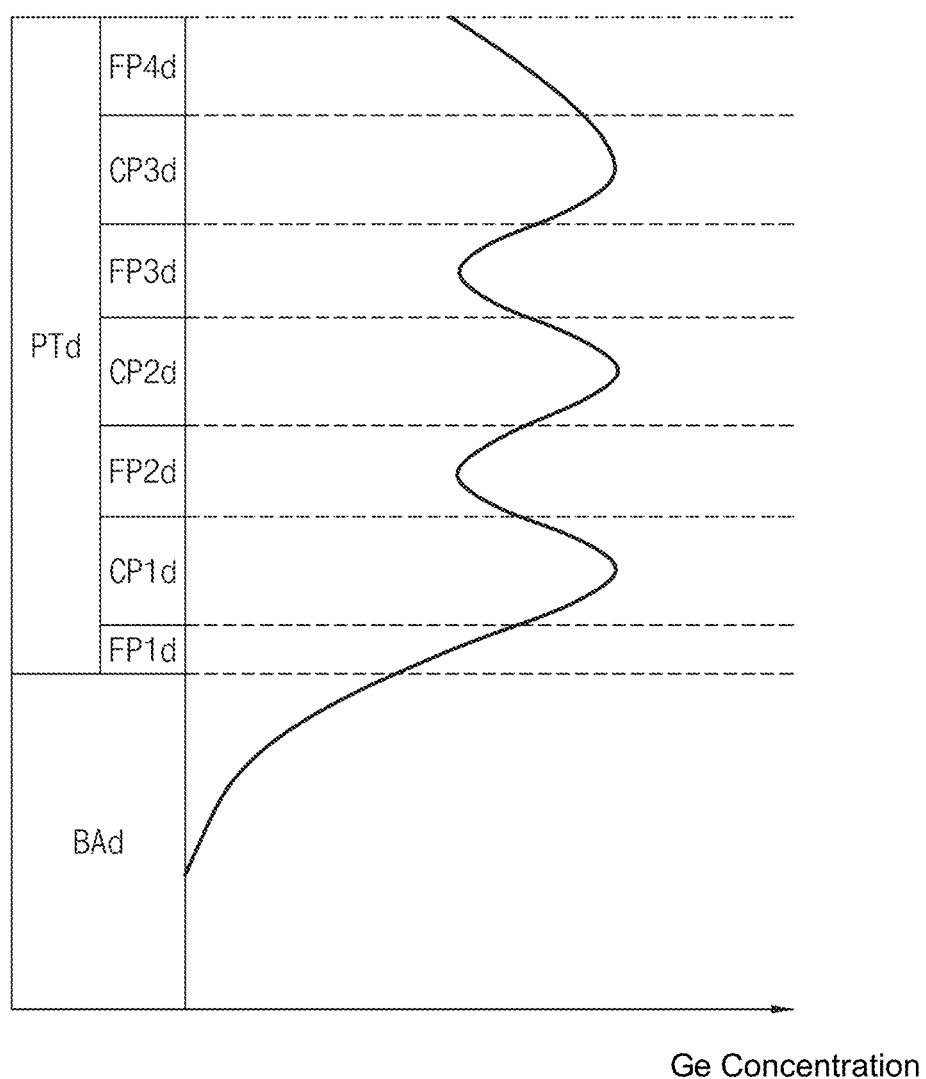
FIG. 15 is a graph explaining a germanium concentration of an active pattern of a semiconductor device according to some example embodiments of the disclosure.

FIG. 15 is a graph explaining a germanium concentration of an active pattern of a semiconductor device according to some example embodiments of the disclosure.

Referring to FIG. 15, an active pattern may include a base portion BAd and a protrusion portion PTd. The protrusion portion PTd may include a first flat pattern portion FP1d, a first curved pattern portion CP1d, a second flat pattern portion FP2d, a second curved pattern portion CP2d, a third flat pattern portion FP3d, a third curved pattern portion CP3d, and a fourth flat pattern portion FP4d.

An average germanium concentration of the first to third curved pattern portions CP1d, CP2d and CP3d may be higher than an average germanium concentration of the first to fourth flat pattern portions FP1d, FP2d, FP3d and FP4d. One of the curved pattern portions CP1d, CP2d and CP3d may have a higher average germanium concentration than ones of the flat pattern portions FP1d, FP2d, FP3d and FP4d adjacent thereto. For example, the average germanium concentration of the third curved pattern portion CP3d may be higher than the average germanium concentration of the third flat pattern portion FP3d, and may be higher than the average germanium concentration of the fourth flat pattern portion FP4d. The germanium concentration of the active pattern may be continuously varied in accordance with the level of the active pattern.

In a method for manufacturing a semiconductor device in accordance with some embodiments of the disclosure, when an annealing process similar to the annealing process described with reference to FIG. 6 is performed for a relatively short time or at a relatively low temperature, the average germanium concentration of the first to third curved pattern portions CP1d, CP2d and CP3d may be higher than the average germanium concentration of the first to fourth flat pattern portions FP1d, FP2d, FP3d and FP4d.

Figure 16:
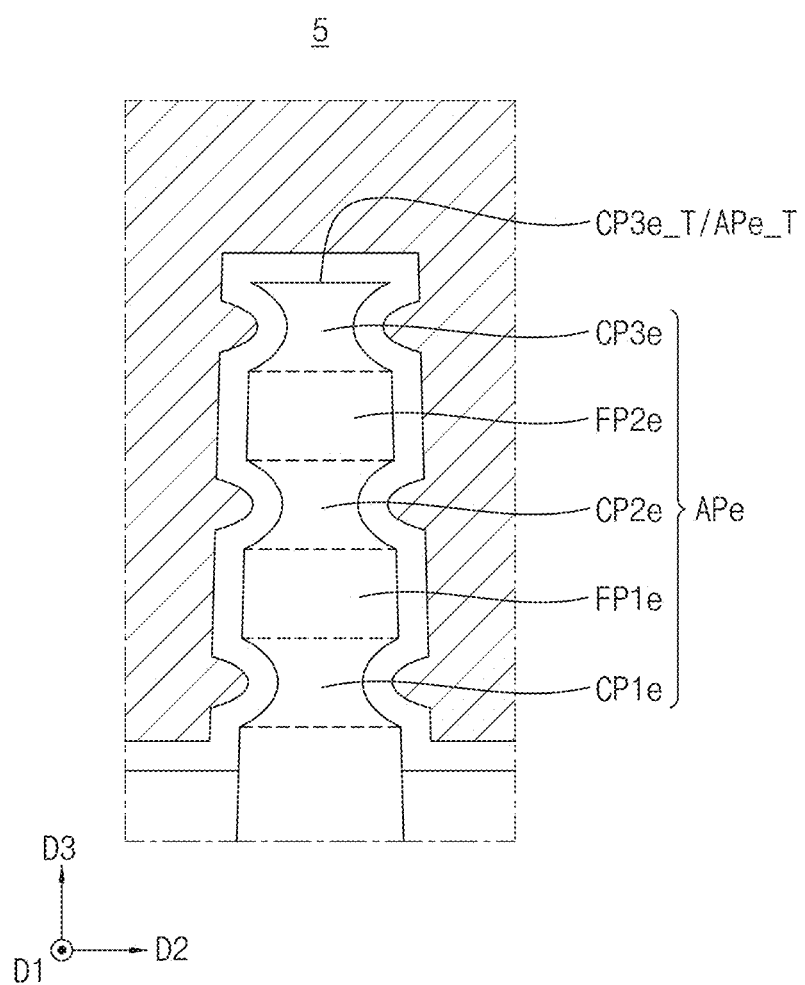
FIG. 16 is a view explaining an active pattern of a semiconductor device according to some example embodiments of the disclosure.

FIG. 16 is a view explaining an active pattern of a semiconductor device according to some example embodiments of the disclosure.

Referring to FIG. 16, an active pattern APe of a semiconductor device 5 may include a first curved pattern portion CP1e, a first flat pattern portion FP1e, a second curved pattern portion CP2e, a second flat pattern portion FP2e, and a third curved pattern portion CP3e sequentially provided in a third direction D3. The third curved pattern portion CP3e may be an uppermost portion of the active pattern APe. In other words, the pattern disposed at a highest level from among the pattern portions of the active pattern APe may be the third curved pattern portion CP3e. A top surface CP3e_T of the third curved pattern portion CP3e may be a top surface APe_T of the active pattern APe. The third curved pattern portion CP3e may be an uppermost portion of a protrusion portion of the active pattern APe.

In a manufacturing method according to some example embodiments, the active pattern APe may be manufactured such that the uppermost portion thereof becomes the third curved pattern portion CP3e by performing a manufacturing process similar to the manufacturing process described with reference to FIGS. 2 to 6.

In a semiconductor device according to the example embodiments of the disclosure, the germanium concentration of an active pattern is continuously varied, and as such a flow of current may be enhanced.

While the above example embodiments of the disclosure have been described with reference to the accompanying drawings, it should be understood by those skilled in the art that various modifications may be made without departing from the scope of the disclosure and without changing essential features thereof. Therefore, the above-described example embodiments should be considered in a descriptive sense only and not for purposes of limitation.

What is claimed is:

1. A semiconductor device comprising:
   an active pattern comprising a base portion and a protrusion portion on the base portion; and
   a source/drain pattern on the base portion,
   wherein the protrusion portion comprises a first curved pattern portion, a first flat pattern portion, and a second curved pattern portion, the first flat pattern portion being at a lower level than the first curved pattern portion, the second curved pattern portion being at a lower level than the first flat pattern portion,
   wherein each of the first and second curved pattern portions has a curved side wall,
   wherein the first flat pattern portion has a flat side wall,
   wherein a germanium concentration of the first curved pattern portion is a higher than a germanium concentration of the first flat pattern portion, and
   wherein the germanium concentration of the first flat pattern portion is higher than a germanium concentration of the second curved pattern portion.

2. The semiconductor device according to claim 1, wherein a level of a boundary between the base portion and the protrusion portion may be equal to a level of a bottom surface of the source/drain pattern.

3. The semiconductor device according to claim 1, wherein the base portion has a flat side wall.

4. The semiconductor device according to claim 1, wherein:
   the protrusion portion further comprises a second flat pattern portion being at a lower level than the second curved pattern portion; and
   the germanium concentration of the second curved pattern portion is higher than a germanium concentration of the second flat pattern portion.

5. The semiconductor device according to claim 4, wherein a minimum width of the second curved pattern portion is smaller than a minimum width of the first flat pattern portion, and is smaller than a minimum width of the second flat pattern portion.

6. The semiconductor device according to claim 1, wherein the first curved pattern portion is an uppermost portion of the active pattern.

7. The semiconductor device according to claim 1, wherein:
   the protrusion portion comprises a plurality of protrusion portions; and
   the source/drain pattern is provided among an adjacent pair of the plurality of protrusion portions.

8. A semiconductor device comprising:
   an active pattern comprising a base portion and a protrusion portion on the base portion; and
   a source/drain pattern on the base portion,
   wherein the protrusion portion comprises a first flat pattern portion and a first curved pattern portion being at a lower level than the first flat pattern portion, a second flat pattern portion being at a lower level than the first curved pattern portion
   wherein a minimum width of the first flat pattern portion is greater than a minimum width of the first curved pattern portion,
   wherein a germanium concentration of the first flat pattern portion is higher than a germanium concentration of the first curved pattern portion, and
   wherein the germanium concentration of the first curved pattern portion is higher than a germanium concentration of the second flat pattern portion.

9. The semiconductor device according to claim 8, wherein:
   a level of a boundary between the base portion and the protrusion portion is equal to a level of a bottom surface of the source/drain pattern; and
   a side wall of the base portion is flat.

10. The semiconductor device according to claim 8, wherein a germanium concentration of the base portion is lower than the germanium concentration of the first curved pattern portion.

11. The semiconductor device according to claim 8, wherein:
    the protrusion portion further comprises a second curved pattern portion being at a lower level than the second flat pattern portion; and
    the germanium concentration of the second flat pattern portion is higher than a germanium concentration of the second curved pattern portion.

12. The semiconductor device according to claim 11, wherein a minimum width of the second flat pattern portion is greater than the minimum width of the first curved pattern portion and a minimum width of the second curved pattern portion.

13. The semiconductor device according to claim 8, wherein a germanium concentration of the protrusion portion decreases continuously as the protrusion portion extends toward the base portion.

14. The semiconductor device according to claim 8, further comprising:
    a gate insulating layer covering the protrusion portion,
    wherein the gate insulating layer comprises a portion curved corresponding to a side wall of the first curved pattern portion.

15. A semiconductor device comprising:
    an active pattern comprising a base portion and a protrusion portion on the base portion;
    a source/drain pattern on the base portion; and
    a gate structure on the protrusion portion,
    wherein a level of a boundary between the base portion and the protrusion portion is equal to a level of a bottom surface of the source/drain pattern,
    wherein the protrusion portion comprises a first flat pattern portion and a first curved pattern portion being at a lower level than the first flat pattern portion,
    wherein a side wall of the first flat pattern portion is flat,
    wherein a side wall of the first curved pattern portion is curved,
    wherein a minimum width of the first flat pattern portion is greater than a minimum width of the first curved pattern portion,
    wherein a germanium concentration of the first flat pattern portion is higher than a germanium concentration of the first curved pattern portion, and
    wherein the germanium concentration of the first curved pattern portion is higher than a germanium concentration of the base portion.

16. The semiconductor device according to claim 15, wherein:

the protrusion portion further comprises a second flat pattern portion being at a lower level than the first curved pattern portion; and the germanium concentration of the first curved pattern portion is higher than a germanium concentration of the second flat pattern portion.

17. The semiconductor device according to claim 15, wherein:

the base portion comprises a flat base portion and a curved base portion being at a lower level than the flat base portion;

a side wall of the flat base portion is flat; and a side wall of the curved base portion is curved.

18. The semiconductor device according to claim 17, wherein a germanium concentration of the flat base portion is higher than a germanium concentration of the curved base portion.

19. The semiconductor device according to claim 17, further comprising:

an insulating spacer covering the side wall of the flat base portion and the side wall of the curved base portion, wherein a portion of the insulating spacer covering the side wall of the curved base portion is curved.

20. The semiconductor device according to claim 15, wherein a width of the first curved pattern portion increases gradually as the first curved pattern portion extends toward the first flat pattern portion.

\* \* \* \* \*